(12) United States Patent
Ichinose

(10) Patent No.: US 8,472,008 B2
(45) Date of Patent: Jun. 25, 2013

(54) MOVABLE BODY APPARATUS, EXPOSURE APPARATUS AND DEVICE MANUFACTURING METHOD

(75) Inventor: Go Ichinose, Fukaya (JP)

(73) Assignee: Nikon Corporation, Tokyo (JP)

( * ) Notice: Subject to any disclaimer, the term of this patent is extended or adjusted under 35 U.S.C. 154(b) by 235 days.

(21) Appl. No.: 12/818,429

(22) Filed: Jun. 18, 2010

(65) Prior Publication Data

US 2011/0007295 A1 Jan. 13, 2011

Related U.S. Application Data

(60) Provisional application No. 61/213,678, filed on Jul. 1, 2009.

(30) Foreign Application Priority Data

Jun. 19, 2009 (JP) ................................. 2009-145972

(51) Int. Cl.
  *G03B 27/58* (2006.01)
  *G03B 27/62* (2006.01)
(52) U.S. Cl.
  USPC .............................................. 355/72; 355/75
(58) Field of Classification Search
  USPC ..................... 355/72–76; 310/10, 12; 378/34, 378/35
  See application file for complete search history.

(56) References Cited

U.S. PATENT DOCUMENTS

| | | | |
|---|---|---|---|
| 4,465,368 A | 8/1984 | Matsuura et al. | |
| 4,780,617 A | 10/1988 | Umatate et al. | |
| 5,646,413 A | 7/1997 | Nishi | |
| 6,351,041 B1 | 2/2002 | Okubo | |
| 6,437,463 B1 | 8/2002 | Hazelton et al. | |
| 6,611,316 B2 | 8/2003 | Sewell | |
| 6,778,257 B2 | 8/2004 | Bleeker et al. | |
| 7,023,610 B2 | 4/2006 | Ohtsuki et al. | |
| 7,161,659 B2 * | 1/2007 | Van Den Brink et al. | ...... 355/53 |

(Continued)

FOREIGN PATENT DOCUMENTS

| | | |
|---|---|---|
| JP | A-2000-056051 | 2/2000 |
| WO | WO 99/49504 A1 | 9/1999 |

(Continued)

OTHER PUBLICATIONS

U.S. Appl. No. 12/818,644 in the name of Go Ichinose, filed Jun. 18, 2010.

(Continued)

*Primary Examiner* — Hung Henry Nguyen
(74) *Attorney, Agent, or Firm* — Oliff & Berridge, PLC

(57) ABSTRACT

A stage device is equipped with a fine movement stage on which a wafer is mounted, a coarse movement stage formed into a frame shape that encloses the periphery of the fine movement stage, which supports the fine movement stage such that the fine movement stage is relatively movable and which is movable along an XY plane, a planar motor that drives the coarse movement stage in a predetermined range within the XY plane, and an actuator that drives the fine movement stage with respect to the coarse movement stage. Therefore, the size, in a direction perpendicular to the XY plane (height direction), of a movable body made up of the fine movement stage and the coarse movement stage can be reduced, compared with a wafer stage having a coarse/fine movement configuration in which the fine movement stage is mounted on the coarse movement stage.

17 Claims, 13 Drawing Sheets

U.S. PATENT DOCUMENTS

| | | |
|---|---|---|
| 2001/0006762 A1 | 7/2001 | Kwan et al. |
| 2002/0041377 A1 | 4/2002 | Hagiwara et al. |
| 2003/0025890 A1 | 2/2003 | Nishinaga |
| 2003/0085676 A1 | 5/2003 | Binnard |
| 2004/0211920 A1 | 10/2004 | Maria Derksen et al. |
| 2004/0239910 A1* | 12/2004 | Ukaji .............................. 355/72 |
| 2005/0002009 A1* | 1/2005 | Lee ................. 355/72 |
| 2005/0259234 A1 | 11/2005 | Hirukawa et al. |
| 2007/0201010 A1 | 8/2007 | Shibazaki |
| 2007/0288121 A1 | 12/2007 | Shibazaki |
| 2008/0054838 A1 | 3/2008 | Butler et al. |
| 2008/0088843 A1 | 4/2008 | Shibazaki |
| 2008/0094594 A1 | 4/2008 | Shibazaki |
| 2008/0143994 A1 | 6/2008 | Shibazaki |
| 2008/0285004 A1 | 11/2008 | Binnard et al. |
| 2009/0233234 A1 | 9/2009 | Shibazaki |

FOREIGN PATENT DOCUMENTS

| | | |
|---|---|---|
| WO | WO 01/35168 A1 | 5/2001 |
| WO | WO 03/065428 A1 | 8/2003 |
| WO | WO 2004/100237 A1 | 11/2004 |
| WO | WO 2006/038952 A2 | 4/2006 |
| WO | WO 2007/083758 A1 | 7/2007 |
| WO | WO 2008/056735 A1 | 5/2008 |
| WO | WO 2010/032877 A1 | 3/2010 |

OTHER PUBLICATIONS

U.S. Appl. No. 12/818,394 in the name of Go Ichinose, filed Jun. 18, 2010.

U.S. Appl. No. 12/818,386 in the name of Go Ichinose, filed Jun. 18, 2010.

U.S. Appl. No. 12/818,579 in the name of Go Ichinose, filed Jun. 18, 2010.

U.S. Appl. No. 12/818,276 in the name of Go Ichinose, filed Jun. 18, 2010.

International Search Report in International Application No. PCT/JP2010/060922; dated Jun. 9, 2011.

Written Opinion of the International Searching Authority in International Application No. PCT/JP2010/060922; dated Jun. 9, 2011.

* cited by examiner

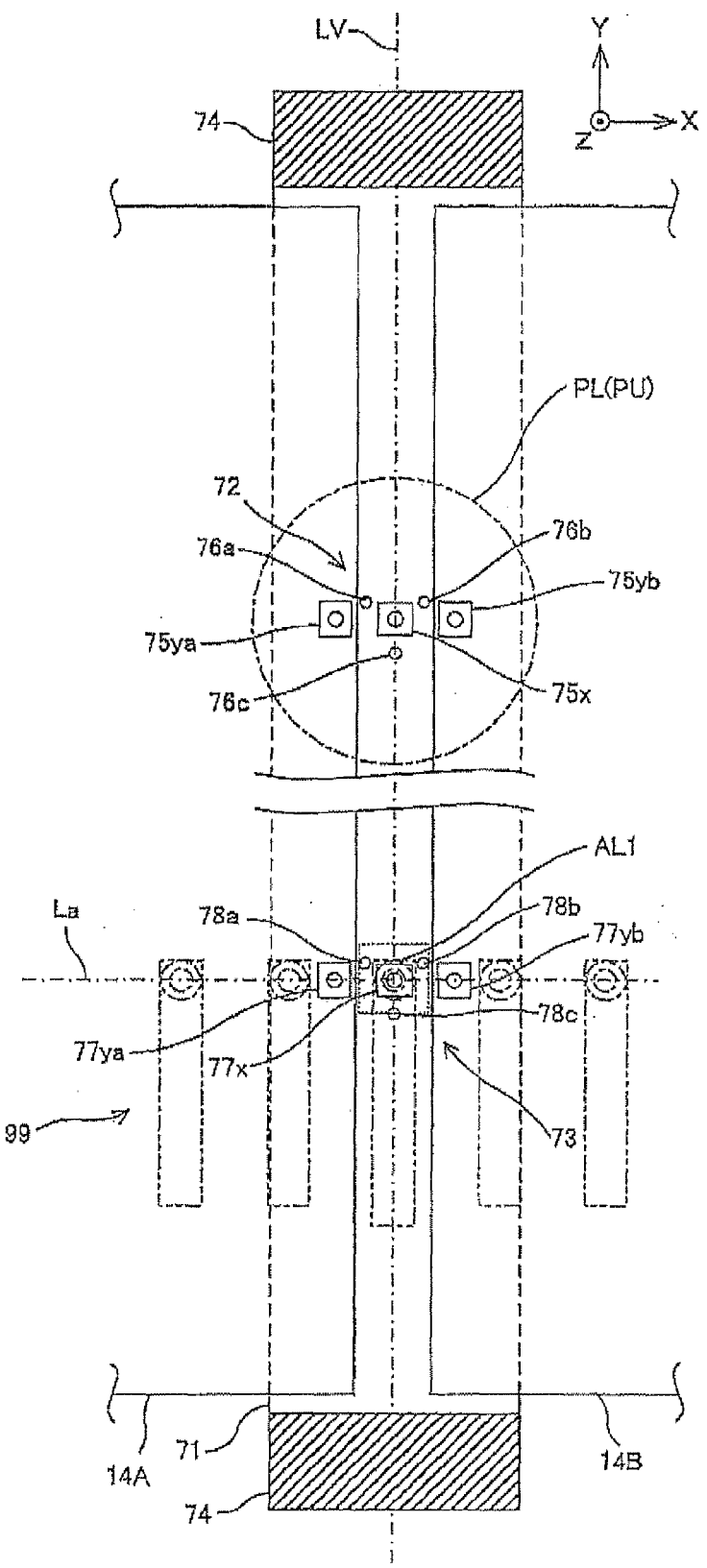

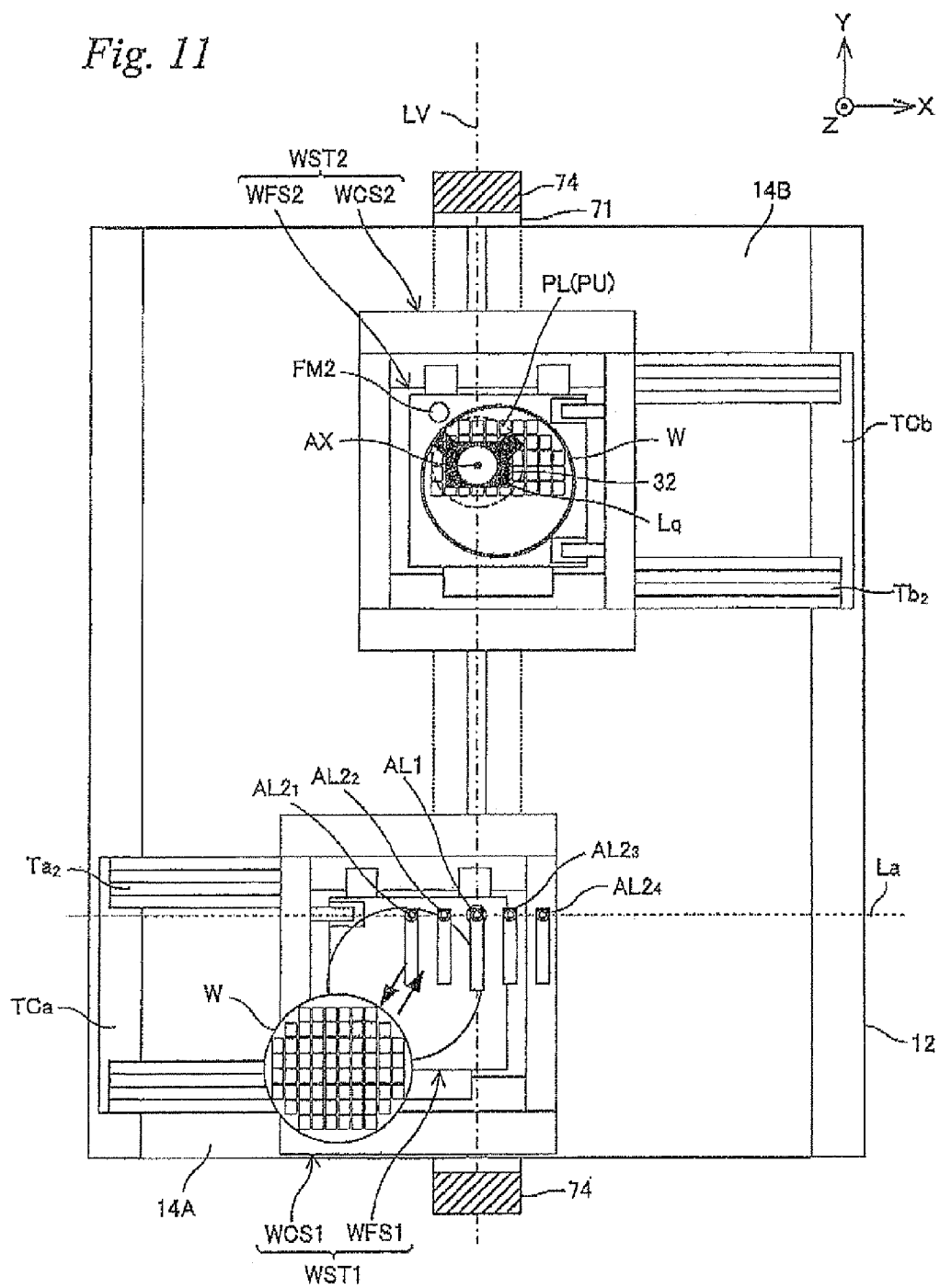

MOVABLE BODY APPARATUS, EXPOSURE APPARATUS AND DEVICE MANUFACTURING METHOD

CROSS-REFERENCE TO RELATED APPLICATIONS

This non-provisional application claims the benefit of Provisional Application No. 61/213,678 filed Jul. 1, 2009, the disclosure of which is hereby incorporated herein by reference in its entirety.

BACKGROUND OF THE INVENTION

1. Field of the Invention

The present invention relates to movable body apparatuses, exposure apparatuses and device manufacturing methods, and more particularly to a movable body apparatus that is suitable as an apparatus to move a specimen such as a wafer or a glass plate, an exposure apparatus equipped with the movable body apparatus, and a device manufacturing method that uses the exposure apparatus.

2. Description of the Background Art

Conventionally, in a lithography process for manufacturing electron devices (microdevices) such as semiconductor devices (integrated circuits or the like) or liquid crystal display elements, an exposure apparatus such as a projection exposure apparatus by a step-and-repeat method (a so-called stepper), or a projection exposure apparatus by a step-and-scan method (a so-called scanning stepper (which is also called a scanner)) is mainly used. This type of the projection exposure apparatus has a stage device that holds a substrate such as a wafer or a glass plate (hereinafter, generically referred to as a wafer) and drives the wafer along a predetermined two-dimensional plane.

In order to perform high-precision exposure, the high-precision positional controllability of a stage is required for the stage device, and in order to improve throughput of the exposure operation, higher speed and higher acceleration of the stage are also required. To cope with these requirements, in recent years, a stage device that controls the position of a wafer within a two-dimensional plane using a planar motor by an electromagnetic force drive method has been developed (e.g. refer to U.S. Pat. No. 6,437,463).

In this case, in the stage device disclosed in U.S. Pat. No. 6,437,463, since the planar motor is configured of a stator embedded in the upper section of a base and a mover fixed to the bottom portion of a substrate table that holds a wafer, a drive force used to drive the substrate table acts between the bottom surface of the substrate table and the upper surface of the base. Meanwhile, the position of the center of gravity in the Z-axis direction of the substrate table that is subject to drive of the planar motor is higher than the bottom surface of the substrate table, and therefore, at the time of drive of the substrate table, there is a possibility that the moment around an axis that is orthogonal to the movement direction (the so-called pitching moment) is generated and the operation of the substrate table is destabilized.

SUMMARY OF THE INVENTION

According to a first aspect of the present invention, there is provided a movable body apparatus, comprising: a first movable body; a second movable body formed into a frame shape that encloses a periphery of the first movable body, which supports the first movable body such that the first movable body is relatively movable, and which is movable along a predetermined two-dimensional plane that includes a first axis and a second axis; a planar motor that drives the second movable body in a predetermined range within the two-dimensional plane; and an actuator that drives the first movable body with respect to the second movable body.

With this apparatus, since the second movable body is placed on the periphery of the first movable body, the size, in a direction perpendicular to the two-dimensional plane (height direction), of a movable body equipped with the first movable body and the second movable body can be reduced, compared with a wafer stage having a coarse/fine movement configuration in which the fine movement stage is mounted on the coarse movement stage. Therefore, the distance in the height direction between the point of action of the thrust of the planar motor and the center of gravity of the movable body can be decreased, which allows the pitching moment generated when the first movable body and the second movable body are driven to be reduced.

According to a second aspect of the present invention, there is provided an exposure apparatus that exposes an object with an energy beam, the apparatus comprising: the movable body apparatus of the present invention in which the object is mounted on the first movable body.

According to a third aspect of the present invention, there is provided a device manufacturing method, comprising: exposing an object using the exposure apparatus of the present invention; and developing the exposed object.

BRIEF DESCRIPTION OF THE DRAWINGS

In the accompanying drawings;

FIG. 5 is a view showing a configuration of a fine movement stage position measuring system;

FIG. 6 is a black diagram used to explain input/output relations of a main controller which the exposure apparatus of FIG. 1 is equipped with;

FIG. 11 is a view showing a state where exposure is performed on a wafer mounted on wafer stage WST2 and wafer exchange is performed on wafer stage WST1;

DESCRIPTION OF THE EMBODIMENTS

An embodiment of the present invention is described below, with reference to FIGS. 1 to 11.

Figure 1:
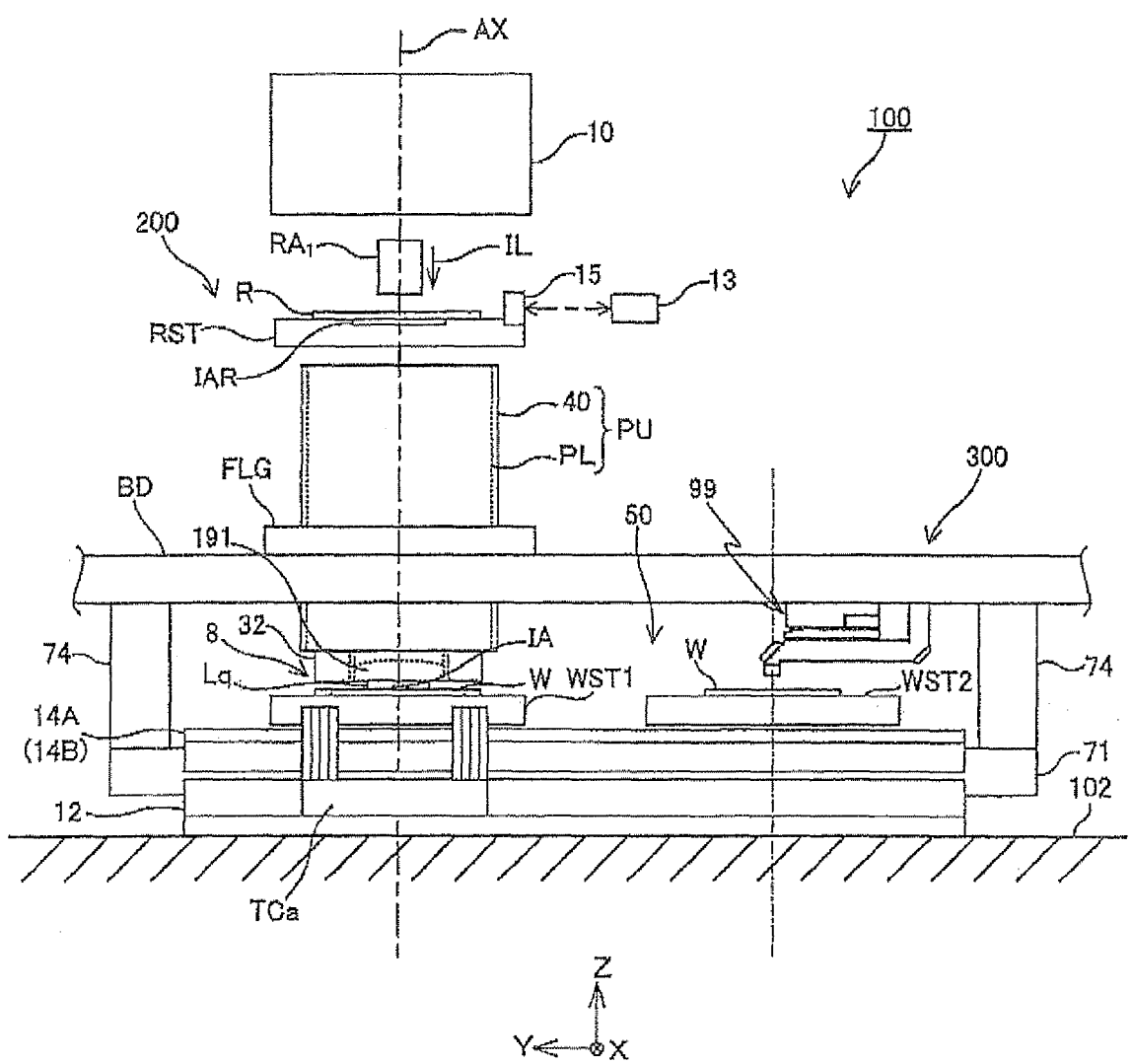
FIG. 1 is a view schematically showing a configuration of an exposure apparatus of an embodiment.

FIG. 1 schematically shows a configuration of an exposure apparatus 100 related to the embodiment. Exposure apparatus 100 is a projection exposure apparatus by a step-and-scan method, which is a so-called scanner. As described later on, a projection optical system PL is provided in the embodiment, and in the description below, the explanation is given assuming that a direction parallel to an optical axis AX of projection optical system PL is a Z-axis direction, a direction in which a reticle and a wafer are relatively scanned within a plane orthogonal to the Z-axis direction is a Y-axis direction, and a direction orthogonal to the Z-axis and the Y-axis is an X-axis direction, and rotational (tilt) directions around the X-axis, Y-axis and Z-axis are $\theta x$, $\theta y$ and $\theta z$ directions, respectively.

As shown in FIG. 1, exposure apparatus 100 is equipped with an exposure station (exposure processing area) 200 placed in the vicinity of the +Y side end on a base board 12, a measurement station (measurement processing area) 300 placed in the vicinity of the −Y side end on base board 12, a stage device 50 that includes two wafer stages WST1 and WST2, their control system and the like. In FIG. 1, wafer stage WST1 is located in exposure station 200 and a wafer W is held on wafer stage WST1. And, wafer stage WST2 is located in measurement station 300 and another wafer W is held on wafer stage WST2.

Exposure station 200 is equipped with an illuminations system 10, a reticle stage RST, a projection unit PD, a local liquid immersion device 8, and the like.

Illumination system 10 includes: a light source; and an illumination optical system that has an illuminance uniformity optical system including an optical integrator and the like, and a reticle blind and the like (none of which are illustrated), as disclosed in, for example, U.S. Patent Application Publication No. 2003/0025890 and the like. Illumination system 10 illuminates a slit-shaped illumination area IAR, which is set by the reticle blind (which is also referred to as a masking system), on reticle R with illumination light (exposure light) IL with substantially uniform illuminance. As illumination light IL, ArF excimer laser light (wavelength: 193 nm) is used as an example.

On reticle stage RST, reticle R having a pattern surface (the lower surface in FIG. 1) on which a circuit pattern and the like are formed is fixed by, for example, vacuum adsorption. Reticle stage RST can be driven with a predetermined stroke at a predetermined scanning speed in a scanning direction (which is the Y-axis direction being a lateral direction of the page surface of FIG. 1) and can also be finely driven in the X-axis direction, with a reticle stage driving system 11 (not illustrated in FIG. 1, see FIG. 6) including, for example, a linear motor or the like.

Positional information within the XY plane (including rotational information in the $\theta z$ direction) of reticle stage RST is constantly detected at a resolution of, for example, around 0.25 nm with a reticle laser interferometer (hereinafter, referred to as a "reticle interferometer") 13 via a movable mirror 15 fixed to reticle stage RST (actually, a Y movable mirror (or a retroreflector) that has a reflection surface orthogonal to the Y-axis direction and an X movable mirror that has a reflection surface orthogonal to the X-axis direction are arranged). The measurement values of reticle interferometer 13 are sent to a main controller 20 (not illustrated in FIG. 1, see FIG. 6). Incidentally, as disclosed in, for example, PCT International Publication No. 2007/083758 (the corresponding U.S. Patent Application Publication No. 2007/0288121) and the like, the positional information of reticle stage RST can be measured by an encoder system.

Above reticle stage RST, a pair of reticle alignment systems $RA_1$ and $RA_2$ by an image processing method, each of which has an imaging device such as a CCD and uses light with an exposure wavelength (illumination light IL in the embodiment) as alignment illumination light, are placed (in FIG. 1, reticle alignment system $RA_2$ hides behind reticle alignment system $RA_1$ in the depth of the page surface), as disclosed in detail in, for example, U.S. Pat. No. 5,646,413 and the like. Main controller 20 detects projected images of a pair of reticle alignment marks (the illustration is omitted) formed on reticle R and a pair of first fiducial marks on a measurement plate, which is described later, on fine movement stage WFS1 (or WFS2), that correspond to the reticle alignment marks via projection optical system PL in a state where the measurement plate is located directly under projection optical system PL, and the pair of reticle alignment systems $RA_3$, and $RA_2$ are used to detect a positional relation between the center of a projection area of a pattern of reticle R by projection optical system PL and a fiducial position on the measurement plate, i.e. the center of the pair of the first fiducial marks, according to such detection performed by main controller 20. The detection signals of reticle alignment systems $RA_1$ and $RA_2$ are supplied to main controller 20 (see FIG. 6) via a signal processing system that is not illustrated. Incidentally, reticle alignment systems $RA_1$ and $RA_2$ do not have to be arranged. In such a case, it is preferable that a detection system that has a light-transmitting section (photo-detection section) arranged at a fine movement stage, which is described later on, is installed so as to detect projected images of the reticle alignment marks, as disclosed in, for example, U.S. Patent Application Publication No. 2002/0041377 and the like.

Projection unit PU is placed below reticle stage RST in FIG. 1. Projection unit PU is supported, via a flange section FLG that is fixed to the outer periphery of projection unit PU, by a main frame (which is also referred to as a metrology frame) BD that is horizontally supported by a support member that is not illustrated. Main frame BD can be configured such that vibration from the outside is not transmitted to the main frame or the main frame does not transmit vibration to the outside, by arranging a vibration isolating device or the like at the support member. Projection unit PU includes a barrel 40 and projection optical system PL held within barrel 40. As projection optical system PL, for example, a dioptric system that is composed of a plurality of optical elements (lens elements) that are disposed along optical axis AX parallel to the Z-axis direction is used. Projection optical system PL is, for example, both-side telecentric and has a predetermined projection magnification (e.g. one-quarter, one-fifth, one-eighth times, or the like). Therefore, when illumination area IAR on reticle R is illuminated with illumination light IL from illumination system 10, illumination light IL passes through reticle R whose pattern surface is placed substantially coincident with a first plane (object plane) of projection optical system PL. Then, a reduced image of a circuit pattern (a reduced image of a part of a circuit pattern) of reticle R within illumination area IAR is formed in an area (hereinafter, also referred to as an exposure area) IA that is conjugate to illumination area IM described above on wafer W, which is placed on the second plane (image plane) side of projection optical system PL and whose surface is coated with a resist (sensitive agent), via projection optical system PL (projection unit PU). Then, by moving reticle R relative to illumination area IAR (illumination light IL) in the scanning direction (Y-axis direction) and also moving wafer W relative to exposure area IA (illumination light IL) in the scanning direction (Y-axis direction) by synchronous drive of reticle stage RST and wafer stage WST1 (or WST2) scanning exposure of one shot area (divided area) on wafer W is performed. Accordingly, a pattern of reticle R is transferred onto the shot area. More specifically, in the embodiment, a pattern of reticle R is generated on wafer W by illumination system 10 and projection optical system PL, and the pattern is formed on wafer W by exposure of a sensitive layer (resist layer) on wafer W with illumination light IL. In this case, projection unit PU is held by main frame BD, and in the embodiment, main frame BD is substantially horizontally supported by a plurality (e.g. three or four) of support members placed on an installation surface (such as a floor surface) each via a vibration isolating mechanism. Incidentally, the vibration isolating mechanism can be placed between each of the support members and main frame ED. Further, as disclosed in, for example, PCT International Publication No. 2006/038952, main frame SD (projection unit PU) can be supported in a suspended manner by a main frame member (not illustrated) placed above projection unit PO or a reticle base or the like.

Local liquid immersion device 8 includes a liquid supply device 5, a liquid recovery device 6 (none of which are illustrated in FIG. 1, see FIG. 6) and a nozzle unit 32 and the like. As shown in FIG. 1, nozzle unit 32 is supported in a suspended manner by main frame BD that supports projection unit PU and the like, via a support member that is not illustrated, so as to enclose the periphery of the lower end of barrel 40 that holds an optical element closest to the image plane side (water W side) that configures projection optical system PL, which is a lens (hereinafter, also referred to as a "tip lens") 191 in this case. Nozzle unit 32 is equipped with a supply opening and a recovery opening of a liquid Lq, a lower surface to which wafer W is placed so as to be opposed and at which the recovery opening is arranged, and a supply flow channel and a recovery flow channel that are respectively connected to a liquid supply pipe 31A and a liquid recovery pipe 31B (none of which are illustrated in FIG. 1, see FIG. 2). One end of a supply pipe (not illustrated) is connected to liquid supply pipe 31A, while the other end of the supply pipe is connected to liquid supply device 5, and one end of a recovery pipe (not illustrated) is connected to liquid recovery pipe 31B, while the other end of the recovery pipe is connected to liquid recovery device 6.

In the embodiment, main controller 20 controls liquid supply device 5 (see FIG. 7) to supply the liquid to the space between tip lens 191 and wafer W and also controls liquid recovery device 6 (see FIG. 7) to recover the liquid from the space between tip lens 191 and wafer W. On this operation, main controller 20 controls the quantity of the supplied liquid and the quantity of the recovered liquid in order to hold a constant quantity of liquid Lq (see FIG. 1) while constantly replacing the liquid in the space between tip lens 191 and wafer W. In the embodiment, as the liquid described above, a pure water (with a refractive index n≈1.44) that transmits the ArF excimer laser light (the light with a wavelength of 193 nm) is to be used.

Figure 2:
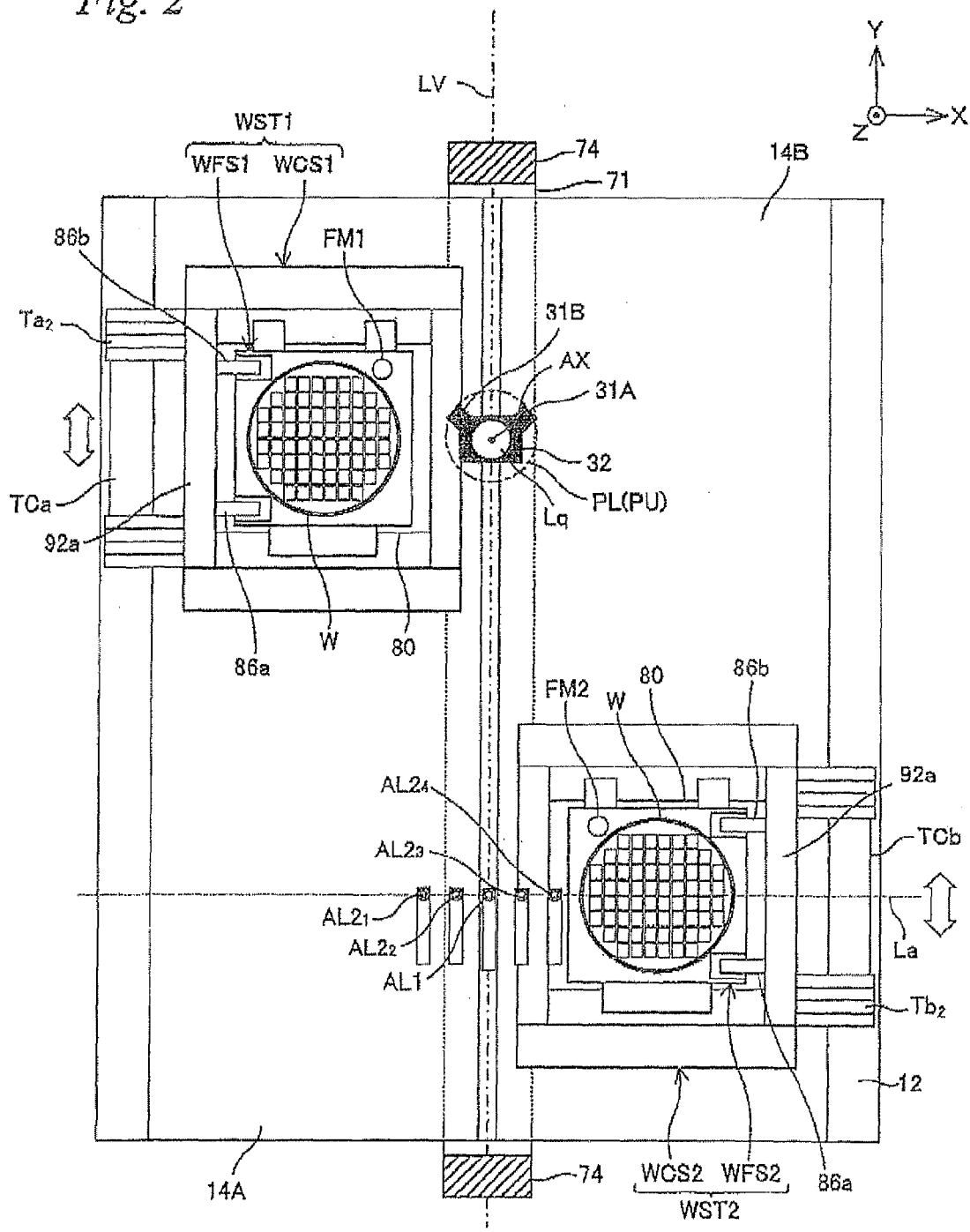
FIG. 2 is a plan view of the exposure apparatus of FIG. 1.

Measurement station 300 is equipped with an alignment device 99 arranged at main frame BD. Alignment device 99 includes five alignment systems AL1 and AL2$_1$ to AL2$_4$ shown in FIG. 2, as disclosed in, for example, U.S. Patent Application Publication No 2008/0088843 and the like. To be more specific, as shown in FIG. 2, a primary alignment system AL1 is placed in a state where its detection center is located at a position a predetermined distance apart on the −Y side from optical axis AX, on a straight line (hereinafter, referred to as a reference axis) LV that passes through the center of projection unit PU (which is optical axis AX of projection optical system PL, and in the embodiment, which also coincides with the center of exposure area IA described previously) and is parallel to the Y-axis. On one side and the other side in the X-axis direction with primary alignment system AL1 in between, secondary alignment systems AL2$_1$ and AL2$_2$, and AL2$_3$ and AL2$_4$, whose detection centers are substantially symmetrically placed with respect to reference axis LV, are arranged respectively. More specifically, the detection centers of the five alignment systems AL1 and AL2$_1$ to AL2$_4$ are placed along a straight line (hereinafter, referred to as a reference axis) La that vertically intersects reference axis LV at the detection center of primary alignment system AL1 and is parallel to the X-axis. Note that a configuration including the five alignment systems AL1 and AL2$_1$ to AL2$_4$ and a holding device (slider) that holds these alignment systems is shown as alignment device 99 in FIG. 1. As disclosed in, for example, U.S. Patent Application Publication No. 2009/0233234 and the like, secondary alignment systems AL2$_1$ to AL2$_4$ are fixed to the lower surface of main frame BD via the movable slider (see FIG. 1), and the relative positions of the detection areas of the secondary alignment systems are adjustable at least in the X-axis direction with a drive mechanism that is not illustrated.

In the embodiment, as each of alignment systems AL1 and AL2$_1$ to AL2$_4$, for example, an FIA (Field Image Alignment) system by an image processing method is used. The configurations of alignment systems AL1 and AL2$_1$ to AL2$_4$ are disclosed in detail in, for example, PCT International Publication No. 2008/056735 and the like. The imaging signal from each of alignment systems AL1 and AL2$_1$ to AL2$_4$ is supplied to main controller 20 (see FIG. 6) via a signal processing system that is not illustrated.

Note that exposure apparatus 100 has a first loading position where a carriage operation of a wafer is performed with respect to wafer stage WST1 and a second loading position where a carriage operation of a wafer is performed with respect to wafer stage WST2, although the loading positions are not illustrated. In the case of the embodiment, the first loading position is arranged on the surface plate 14A side and the second loading position is arranged on the surface plate 14B side.

As shown in FIG. 1, stage device 50 is equipped with base board 12, a pair of surface plates 14A and 14B placed above base board 12 (in FIG. 1, surface plate 14B hides behind surface plate 14 in the depth of the page surface), the two wafer stages WST1 and WST2 that move on a guide surface parallel to the XY plane that is set by the upper surfaces of the pair of surface plates 14A and 14B, tube carriers TCa and TCb (tube carrier TCb is not illustrated in FIG. 1, see the drawings such as FIGS. 2 and 3) that are respectively connected to wafer stages WST1 and WST2 via piping/wiring systems (hereinafter, referred to as tubes for the sake of convenience) Ta$_2$ and Tb$_2$ (not illustrated in FIG. 1, see FIGS. 2 and 3), a measurement system that measures positional information of wafer stages WST1 and WST2, and the like. The electric source/electric power (electric current) for various types of sensors, motors, or the electrostatic chuck mechanism and the like, the pressurized air for air bearings, and the like are supplied from the outside to wafer stages WST1 and WST2 via tubes Ta$_2$ and Tb$_2$, respectively. Note that, in the description below, the electric source/electric power (electric current), the pressurized air and the like are also referred to as the power usage collectively. In the case where a vacuum suction force is necessary, this is also included in the power usage.

Figure 3:
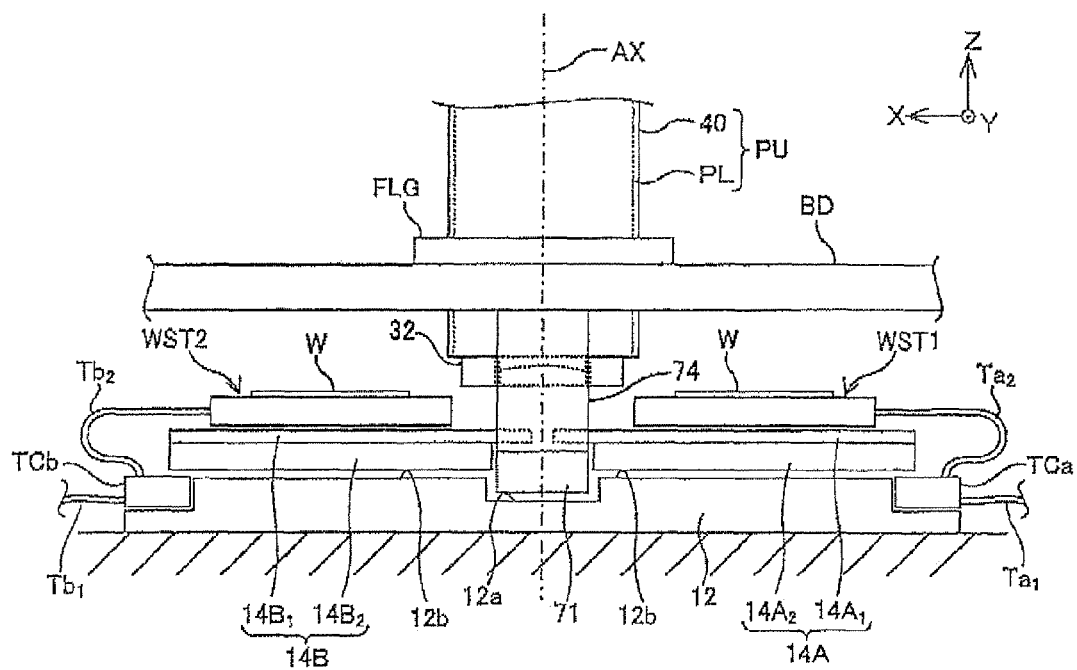
FIG. 3 is a side view of the exposure apparatus of FIG. 1 when viewed from the +Y side.

Base board 12 is made up of a member having a tabular outer shape, and as shown in FIG. 1, is substantially horizontally (parallel to the XY plane) supported via a vibration isolating mechanism (the illustration is omitted) on a floor surface 102. In the center portion in the X-axis direction of the upper surface of base board 12, a recessed section 12a (recessed groove) extending in a direction parallel to the Y-axis is formed, as shown in FIG. 3. On the upper surface side of base board 12 (excluding a portion where recessed section 12a is formed, in this case), a coil unit (the illustration is omitted) is housed that includes a plurality of dolls placed in a matrix shape with the XY two-dimensional directions serving as a row direction and a column direction.

As shown in FIG. 2, surface plates 14A and 14B are each made up of a rectangular plate-shaped member whose longitudinal direction is in the Y-axis direction in a planar view (when viewed from above) and are respectively placed on the −X side and the +X side of reference axis LV. Surface plate 14A and surface plate 14B are placed with a very narrow gap therebetween in the X-axis direction, symmetric with respect to reference axis LV. By finishing the upper surface (the +Z side surface) of each of surface plates 14A and 14B such that the upper surface has a very high flatness degree, it is possible to make the upper surfaces function as a guide surface with respect to the Z-axis direction used when each of wafer stages WST1 and WST2 moves following the XY plane. Alternatively, a configuration can be employed in which a force in the Z-axis direction is made to act on wafer stages WST1 and WST2 by planar motors, which are described later on, to magnetically levitate wafer stages WST1 and WST2 above surface plates 14A and 14B. In the case of the embodiment, the configuration that uses the planar motors is employed and static gas bearings are not used, and therefore, the flatness degree of the upper surfaces of surface plates 14A and 14B does not have to be so high as in the above description.

As shown in FIG. 3, surface plates 14A and 14B are supported on upper surfaces 12b of both side portions of recessed section 12a of base board 12 via air bearings (or rolling bearings) that are not illustrated.

Surface plates 14A and 14B respectively have first sections $14A_1$, and $14B_1$ each having a relatively thin plate shape on the upper surface of which the guide surface is formed, and second sections $14A_2$ and $14B_2$ each having a relatively thick plate shape and being short in the X-axis direction that are integrally fixed to the lower surfaces of first sections $14A_1$ and $14B_1$, respectively. The end on the +X side of first section $14A_1$ of surface plate 14A slightly overhangs, to the +X side, the end surface on the +X side of second section $14A_2$, and the end on the −X side of first section $14B_1$ of surface plate 14B slightly overhangs, to the −X side, the end surface on the −X side of second section $14B_2$. However, the configuration is not limited to the above-described one, and a configuration can be employed in which the overhangs are not arranged.

Inside each of first sections $14A_1$ and $14B_1$, a coil unit (the illustration is omitted) is housed that includes a plurality of coils placed in a matrix shape with the XY two-dimensional directions serving as a row direction and a column direction. The magnitude and direction of the electric current supplied to each of the plurality of coils that configure the respective coil units are controlled by main controller 20 (see FIG. 6).

Inside (on the bottom portion of) second section $14A_2$ of surface plate 14A, a magnetic unit (the illustration is omitted), which is made up of a plurality of permanent magnets (and yokes that are not illustrated) placed in a matrix shape with the XY two-dimensional directions serving as a row direction and a column direction, is housed so as to correspond to the coil unit housed on the upper surface side of base board 12. The magnetic unit configures, together with the coil unit of base board 12, a surface plate driving system 60A (see FIG. 6) that is made up of a planar motor by the electromagnetic force (Lorentz force) drive method that is disclosed in, for example, U.S. Patent Application Publication No 2003/0085676 and the like. Surface plate driving system 60A generates a drive force that drives surface plate 14A in directions of three degrees of freedom (X, 1, θz) within the XY plane.

Similarly, inside (on the bottom surface of) second section $14B_2$ of surface plate 14B, a magnetic unit (the illustration is omitted) made up of a plurality of permanent magnets (and yokes that are not illustrated) is housed that configures, together with the coil unit of base board 12, a surface plate driving system 60B (see FIG. 6) made up of a planar motor that drives surface plate 14B in the directions of three degrees of freedom within the XY plane. Incidentally, the placement of the coil unit and the magnetic unit of the planar motor that configures each of surface plate driving systems 60A and 60B can be reverse (a moving coil type that has the magnetic unit on the base board side and the coil unit on the surface plate side) to the above-described case (a moving magnet type).

Positional information of surface plates 14A and 14B in the directions of three degrees of freedom is obtained (measured) independently from each other by a first surface plate position measuring system 69A and a second surface plate position measuring system 69B (see FIG. 6), respectively, which each include, for example, an encoder system. The output of each of first surface plate position measuring system 69A and second surface plate position measuring system 69B is supplied to main controller 20 (see FIG. 6), and main controller 20 controls the magnitude and direction of the electric current, supplied to the respective coils that configure the coil units of surface plate driving systems 60A and 60B, using (based on) the outputs of surface plate position measuring systems 69A and 69B, thereby controlling the respective positions of surface plates 14A and 14B in the directions of three degrees of freedom within the XY plane, as needed. Main controller 20 drives surface plates 14A and 14B via surface plate driving systems 60A and 60B using (based on) surface plate position measuring systems 69A and 69B to return surface plates 14A and 14B to the reference position of the surface plates such that the movement distance of surface plates 14A and 14B from the reference position falls within a predetermined range, when surface plates 14A and 14B function as countermasses to be described later on. More specifically, surface plate driving systems 60A and 60B are used as trim motors.

While the configurations of first surface plate position measuring system 69A and second surface plate position measuring system 69B are not especially limited, an encoder system can be used in which, for example, encoder heads, which obtain (measure) positional information of the respective surface plates 14A and 14B in the directions of three degrees of freedom within the XY plane by irradiating measurement beams on scales (e.g. two-dimensional gratings) placed on the lower surfaces of second sections $14A_2$ and $14B_2$ respectively and using reflected light (diffraction light from the two-dimensional grating) obtained by the irradiation, are placed at base board 12 (or the encoder heads are placed at second sections $14A_2$ and $14B_2$ and scales, are placed at base board 12, respectively). Incidentally, it is also possible to obtain (measure) the positional information of surface plates 14A and 14B by, for example, an optical interferometer system or a measurement system that is a combination of an optical interferometer system and an encoder system.

One of the wafer stages, wafer stage WST1 is equipped with a fine movement stage (which is also referred to as a table) WFS1 that holds wafer W and a coarse movement stage WCS1 having a rectangular frame shape that encloses the periphery of fine movement stage WFS1, as shown in FIG. 2. The other of the wafer stages, wafer stage WST2 is equipped with a fine movement stage WFS2 that holds wafer W and a coarse movement stage WCS2 having a rectangular frame shape that encloses the periphery of fine movement stage WFS2, as shown in FIG. 2. As is obvious from FIG. 2, wafer stage WST2 has completely the same configuration including the drive system, the position measuring system and the like, as wafer stage WST1 except that wafer stage WST2 is placed in a state laterally reversed with respect to wafer stage WST1. Consequently, in the description below, wafer stage WST1 is representatively focused on and described, and wafer stage WST2 is described only in the case where such description is especially needed.

Figure 4A:
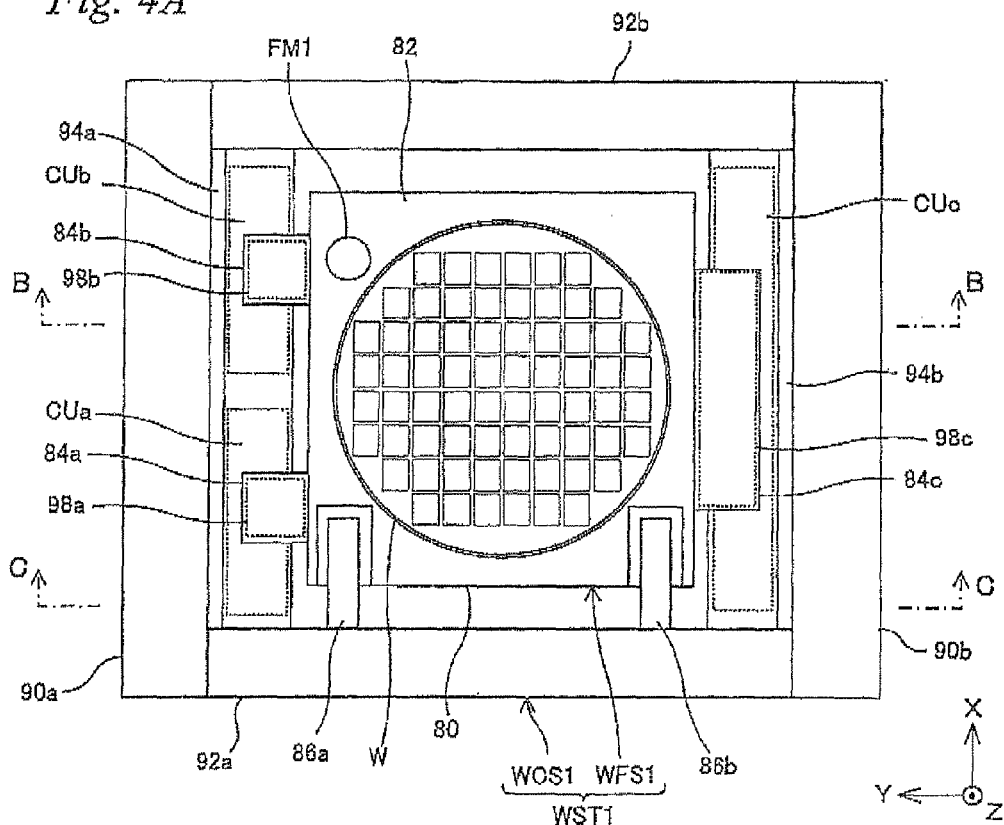
FIG. 4A is a plan view of a wafer stage WST1 which the exposure apparatus is equipped with, FIG. 4B is an end view of the cross section taken along the line B-B of FIG. 4A.

As shown in FIG. 4A, coarse movement stage WCS1 has a pair of coarse movement slider sections 90a and 90b which are placed parallel to each other, spaced apart in the Y-axis direction, and each of which is made up of a rectangular parallelepiped member whose longitudinal direction is in the X-axis direction, and a pair of coupling members 92a and 92b each of which is made up of a rectangular parallelepiped member whose longitudinal direction is in the Y-axis direction, and which couple the pair of coarse movement slider sections 90a and 90b with one ends and the other ends thereof in the Y-axis direction. More specifically, coarse movement stage WCS1 is formed into a rectangular frame shape with a rectangular opening section, in its center portion, that penetrates in the Z-axis direction.

Figure 4B:
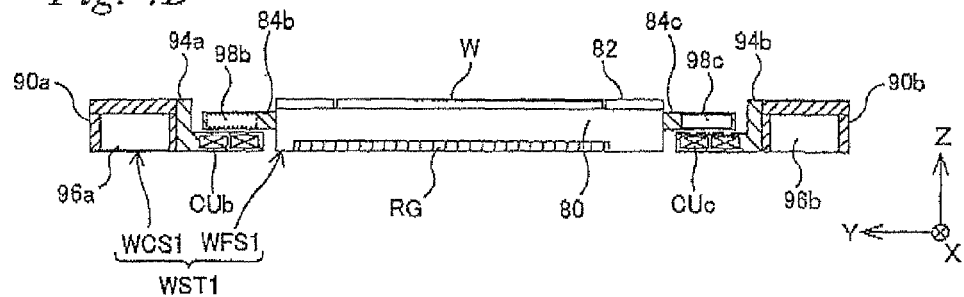
FIG. 4C is an end view of the cross section taken along the line C-C of FIG. 4A.
Figure 4C:
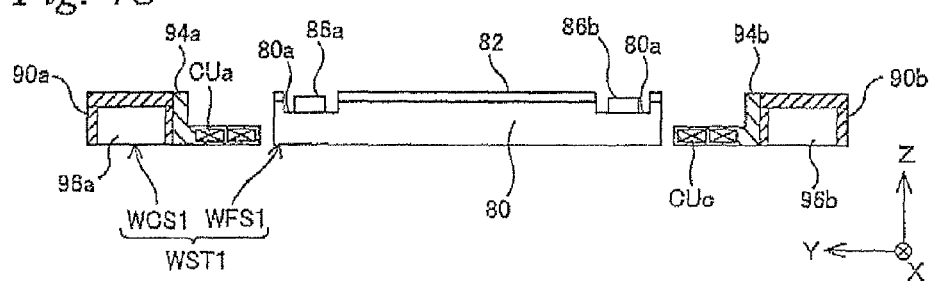

Inside (on the bottom portions of) coarse movement slider sections 90a and 90b, as shown in FIGS. 4B and 4C, magnetic units 96a and 96b are housed respectively. Magnetic units 96a and 96b correspond to the coil units housed inside first sections 14A$_1$ and 14B$_1$ of surface plates 14A and 14B, respectively, and are each made up of a plurality of magnets placed in a matrix shape with the XY two-dimensional directions serving as a row direction and a column direction. Magnetic units 96a and 96b configure, together with the coil units of surface plates 14A and 14B, a coarse movement stage driving system 62A (see FIG. 6) that is made up of a planar motor by the electromagnetic force (Lorentz force) drive method that is capable of generating drive forces in the directions of six degrees of freedom to coarse movement stage WCS1, which is disclosed in, for example, U.S. Patent Application Publication No. 2003/0085676 and the like. Further, similar thereto, magnetic units, which coarse movement stage WCS2 (see FIG. 2) of wafer stage WST2 has, and the coil units of surface plates 14A and 14B configure a coarse movement stage driving system 62B (see FIG. 6) made up of a planar motor. In this case, since a force in the Z-axis direction acts on coarse movement stage WCS1 (or WCS2), the coarse movement stage is magnetically levitated above surface plates 14A and 14B. Therefore, it is not necessary to use static gas bearings for which relatively high machining accuracy is required, and thus it becomes unnecessary to increase the flatness degree of the upper surfaces of surface plates 14A and 14B.

Incidentally, while coarse movement stages WCS1 and WCS2 of the embodiment have the configuration in which only coarse movement slider sections 90a and 90b have the magnetic units of the planar motors, this is not intended to be limiting, and the magnetic unit can be placed also at coupling members 92a and 92b. Further, the actuators to drive coarse movement stages WCS1 and WCS2 are not limited to the planar motors by the electromagnetic force (Lorentz force) drive method, but for example, planar motors by a variable magnetoresistance drive method or the like can be used. Further, the drive directions of coarse movement stages WCS1 and WCS2 are not limited to the directions of six degrees of freedom, but can be, for example, only directions of three degrees of freedom (X, Y, θz) within the XY plane. In this case, coarse movement stages WCS1 and WCS2 should be levitated above surface plates 14A and 14B, for example, using static gas bearings (e.g. air bearings). Further, in the embodiment, while the planar motor of a moving magnet type is used as each of coarse movement stage driving systems 62A and 62B, this is not intended to be limiting, and a planar motor of a moving coil type in which the magnetic unit is placed at the surface plate and the coil unit is placed at the coarse movement stage can also be used.

On the side surface on the −Y side of coarse movement slider section 90a and on the side surface on the +Y side of coarse movement slider section 901p, guide members 94a and 94b that function as a guide used when fine movement stage WFS1 is finely driven are respectively fixed. As shown in FIG. 4B, guide member 94a is made up of a member having an L-like sectional shape arranged extending in the X-axis direction and its lower surface is placed flush with the lower surface of coarse movement slider section 90a. Guide member 94b is configured and placed similar to guide member 94a, although guide member 94b is bilaterally symmetric to guide member 94a.

Inside (on the bottom surface of) guide member 94a, a pair of coil units CUa and CUb, each of which includes a plurality of coils placed in a matrix shape with the XY two-dimensional directions serving as a row direction and a column direction, are housed at a predetermined distance in the X-axis direction (see FIG. 4A). Meanwhile, inside (on the bottom portion of) guide member 94b, one coil unit CUc, which includes a plurality of coils placed in a matrix shape with the XY two-dimensional directions serving as a row direction and a column direction, is housed (see FIG. 4A). The magnitude and direction of the electric current supplied to each of the coils that configure coil units CUa to CUc are controlled by main controller 20 (see FIG. 6).

Coupling members 92a and 92b are formed to be hollow, and piping members, wiring members and the like, which are not illustrated, used to supply the power usage to fine movement stage WFS1 are housed inside. Inside coupling members 92a and/or 92b, various types of optical members (e.g. an aerial image measuring instrument, an uneven illuminance measuring instrument, an illuminance monitor, a wavefront aberration measuring instrument, and the like) can be housed.

In this case, when wafer stage WST1 is driven with acceleration/deceleration in the Y-axis direction on surface plate 14A, by the planar motor that configures coarse movement stage driving system 62A (e.g. when wafer stage WST1 moves between exposure station 200 and measurement station 300), surface plate 14A is driven in a direction opposite to wafer stage WST1 according to the so-called law of action and reaction (the law of conservation of momentum) owing to the action of a reaction force by the drive of wafer stage WST1. Further, it is also possible to make a state where the law of action and reaction described above does not hold, by generating a drive force in the Y-axis direction with surface plate driving system 60A.

Further, when wafer stage WST 2 is driven in the Y-axis direction on surface plate 14B, surface plate 14B is also driven in a direction opposite to wafer stage WST2 according to the so-called law of action and reaction (the law of conservation of momentum) owing to the action of a reaction force of a drive force of wafer stage WST2. More specifically, surface plates 14A and 14B function as the countermasses and the momentum of a system composed of wafer stages WST1 and WST2 and surface plates 14A and 14B as a whole is conserved and movement of the center of gravity does not occur. Consequently, any inconveniences do not arise such as the uneven loading acting on surface plates 14A and 14B owing to the movement of wafer stages WST1 and WST2 in the Y-axis direction. Incidentally, regarding wafer stage WST2 as well, it is possible to make a state where the law of action and reaction described above doss not hold, by generating a drive force in the Y-axis direction with surface plate driving system 60B.

Further, surface plates 14A and 14B function as the countermasses owing to the action of a reaction force of a drive force in the X-axis direction of wafer stages WST1 and WST2.

As shown in FIGS. 4A and 4B, fine movement stage WFS1 is equipped with a main section 80 made up of a member having a rectangular shape in a planar view, a pair of fine movement slider sections 84a and 84b fixed to the side surface on the +Y side of main section 80, and a fine movement slider section 84c fixed to the side surface on the −Y side of main section 80.

Main section 80 is formed by a material with a relatively small coefficient of thermal expansion, e.g., ceramics, glass or the like, and is supported by coarse movement stage WCS1 in a noncontact manner in a state where the bottom surface of the main section is located flush with the bottom surface of coarse movement stage WCS1. Main section 80 can be hollowed for reduction in weight. Incidentally, the bottom surface of main section 80 does not necessarily have to be flush with the bottom surface of coarse movement stage WCS1.

In the center of the upper surface of main section 80, a wafer holder (not illustrated) that holds wafer W by vacuum adsorption or the like is placed. In the embodiment, the wafer holder by a so-called pin chuck method is used in which a plurality of support sections (pin members) that support wafer W are formed, for example, within an annular protruding section (rim section), and the wafer holder, whose one surface (front surface) serves as a wafer mounting surface, has a two-dimensional grating RG1 to be described later and the like arranged on the other surface (back surface) side. Incidentally, the wafer holder can be formed integrally with fine movement stage WFS1 (main section 80), or can be fixed to main section 80 so as to be detachable via, for example, a holding mechanism such as an electrostatic chuck mechanism or a clamp mechanism. In this case, grating RG is to be arranged on the back surface side of main section 80. Further, the wafer holder can be fixed to main section 80 by an adhesive agent or the like. On the upper surface of main section 80, as shown in FIG. 4A, a plate (liquid-repellent plate) 82, in the center of which a circular opening that is slightly larger than wafer W (wafer holder) is formed and which has a rectangular outer shape (contour) that corresponds to main section 80, is attached on the outer side of the wafer holder (mounting area of wafer W). The liquid-repellent treatment against liquid Lq is applied to the surface of plate 82 (the liquid-repellent surface Ls formed). In the embodiment, the surface of plate 82 includes a base material made up of metal, ceramics, glass or the like, and a film of liquid-repellent material formed on the surface of the base material. The liquid-repellent material includes, for example, PFA (Tetra fluoro ethylene-perfluoro alkylvinyl ether copolymer), PTFE (Poly tetra fluoro ethylene), Teflon (registered trademark) or the like. Incidentally, the material that forms the film can be an acrylic-type resin or a silicon-series resin. Further, the entire plate 82 can be formed with at least one of the PFA, PTFE, Teflon (registered trademark), acrylic-type resin and silicon-series resin. In the embodiment, the contact angle of the upper surface of plate 82 with respect to liquid Lq is, for example, more than or equal to 90 degrees. On the surface of coupling member 92b described previously as well, the similar liquid-repellent treatment is applied.

Plate 82 is fixed to the upper surface of main section 80 such that the entire surface (or a part of the surface) of plate 82 is flush with the surface of wafer W. Further, the surfaces of plate 82 and wafer W are located substantially flush with the surface of coupling member 92b described previously. Further, in the vicinity of a corner on the +X side located on the +Y side of plate 82, a circular opening is formed, and a measurement plate FM1 is placed in the opening without any gap therebetween in a state substantially flush with the surface of wafer W. On the upper surface of measurement plate FM1, the pair of first fiducial marks to be respectively detected by the pair of reticle alignment systems $RA_1$ and $RA_2$ (see FIGS. 1 and 6) described earlier and a second fiducial mark to be detected by primary alignment system AL1 (none of the marks are illustrated) are formed. In fine movement stage WFS2 of wafer stage WST2, as shown in FIG. 2, in the vicinity of a corner on the −X side located on the +Y side of plate 82, a measurement plate FM2 that is similar to measurement plate FM1 is fixed in a state substantially flush with the surface of wafer W. Incidentally, instead of attaching plate 82 to fine movement stage WFS1 (main section 80), it is also possible, for example, that the wafer holder is formed integrally with fine movement stage WFS1 and the liquid-repellent treatment is applied to the peripheral area, which encloses the wafer holder (the same area as plate 82 (which may include the surface of the measurement plate)) of the upper surface of fine movement stage WFS1 and the liquid repellent surface is formed.

In the center portion of the lower surface of main section 80 of fine movement stage WFS1, as shown in FIG. 4B, a plate having a predetermined thin plate shape, which is large to the extent of covering the wafer holder (mounting area of wafer W) and measurement plate FM1 (or measurement plate FM2 in the case of fine movement stage WFS2), is placed in a state where its lower surface is located substantially flush with the other section (the peripheral section) (the lower surface of the plate does not protrude below the peripheral section). On one surface (the upper surface (or the lower surface)) of the plate, two-dimensional grating RG (hereinafter, simply referred to as grating RG) is formed. Grating RG includes a reflective diffraction grating (X diffraction grating) whose periodic direction is in the X-axis direction and a reflective diffraction grating (Y diffraction grating) whose periodic direction is in the Y-axis direction. The plate is formed by, for example, glass, and grating RG is created by graving the graduations of the diffraction gratings at a pitch, for example, between 138 nm to 4 μm, e.g. at a pitch of 1 μm. Incidentally, grating RG can also cover the entire lower surface of main section 80. Further, the type of the diffraction grating used for grating RG is not limited to the one on which grooves or the like are mechanically formed, but for example, a diffraction grating that is created by exposing interference fringes on a photosensitive resin can also be employed. Incidentally, the configuration of the plate having a thin plate shape is not necessarily limited to the above-described one.

As shown in FIG. 4A, the pair of fine movement slider sections 84a and 84b are each a plate-shaped member having a roughly square shape in a planar view, and are placed apart at a predetermined distance in the X-axis direction, on the side surface on the +Y side of main section 80. Fine movement slider section 84c is a plate-shaped member having a rectangular shape elongated in the X-axis direction in a planar view, and is fixed to the side surface on the −Y side of main section 80 in a state where one end and the other end in its longitudinal direction are located on straight lines parallel to the Y-axis that are substantially collinear with the centers of fine movement slider sections 84a and 84b.

The pair of fine movement slider sections 84a and 84b are respectively supported by guide member 94a described earlier, and fine movement slider section 84c is supported by guide member 94b. More specifically, fine movement stage WFS is supported at three noncollinear positions with respect to coarse movement stage WCS.

Inside fine movement slider sections 84a to 84c, magnetic units 98a, 98b and 98c, which are each made up of a plurality of permanent magnets (and yokes that are not illustrated) placed in a matrix shape with the XY two-dimensional directions serving as a row direction and a column direction, are housed, respectively, so as to correspond to coil units CUa to CUc that guide sections 94a and 94b of coarse movement stage WCS1 have. Magnetic unit 98a together with coil unit CUa, magnetic unit 98b together with coil unit CUb, and magnetic unit 98c together with coil unit CUc respectively configure three planar motors by the electromagnetic force (Lorentz force) drive method that are capable of generating drive forces in the X-axis, Y-axis and Z-axis directions, as disclosed in, for example, U.S. Patent Application Publication No. 2003/0085676 and the like, and these three planar motors configure a fine movement stage driving system 64A (see FIG. 6) that drives fine movement stage WFS1 in directions of six degrees of freedom (X, Y, Z, θx, θy and θz).

In wafer stage WST2 as well, three planar motors composed of coil units that coarse movement stage WCS2 has and magnetic units that fine movement stage WFS2 has are configured likewise, and these three planar motors configure a fine movement stage driving system 64B (see FIG. 6) that drives fine movement stage WFS2 in directions of six degrees of freedom (X, Y, Z, θx, θy and θz).

Fine movement stage WFS1 is movable in the X-axis direction, with a longer stroke compared with the directions of the other five degrees of freedom, along guide members 94a and 94b arranged extending in the X-axis direction. The same applies to fine movement stage WFS2.

With the configuration as described above, fine movement stage WFS1 is movable in the directions of six degrees of freedom with respect to coarse movement stage WCS1. Further, on this operation, the law of action and reaction (the law of conservation of momentum) that is similar to the previously described one holds owing to the action of a reaction force by drive of fine movement stage WFS1. More specifically, coarse movement stage WCS1 functions as the countermass of fine movement stage WFS1, and coarse movement stage WCS1 is driven in a direction opposite to fine movement stage WFS1. Fine movement stage WFS2 and coarse movement stage WCS2 has the similar relation.

Note that, in the embodiment, when broadly driving fine movement stage WFS1 (or WFS2) with acceleration/deceleration in the X-axis direction (e.g. in the cases such as when a stepping operation between shot areas is performed during exposure), main controller 20 drives fine movement stage WFS1 (or WSF2) in the X-axis direction by the planar motors that configure fine movement stage driving system 62A (or 62B). Further, along with this drive, main controller 20 gives the initial velocity, which drives coarse movement stage WCS1 (or WCS2) in the same direction as with fine movement stage WFS1 (or WFS2), to coarse movement stage WCS1 (or WCS2), via coarse movement stage driving system 62A (or 62B) (drives coarse movement stage WCS1 (or WCS2) in the same direction as with fine movement stage WFS1 (or WFS2)). This causes coarse movement stage WCS1 (or WCS2) to function as the so-called countermass. Accordingly, it is possible to decrease a movement distance of coarse movement stage WCS1 (or WCS2) in the opposite direction that accompanies the movement of fine movement stage WFS1 (or WFS2) in the X-axis direction (that is caused by a reaction force of the drive force). Especially, in the case where fine movement stage WFS1 (or WFS2) performs an operation including the step movement in the X-axis direction, or more specifically, fine movement stage WFS1 (or WFS2) performs an operation of alternately repeating the acceleration and the deceleration in the X-axis direction, the stroke in the X-axis direction needed for the movement of coarse movement stage WCS1 (or WCS2) can be the shortest. On this operation, main controller 20 should give coarse movement stage WCS1 (or WCS2) the initial velocity with which the center of gravity of the entire system of wafer stage WST1 (or WST2) that includes the fine movement stage and the coarse movement stage performs constant velocity motion in the X-axis direction. With this operation, coarse movement stage WCS1 (or WCS2) performs a back-and-forth motion within a predetermined range with the position of fine movement stage. WFS1 (or WFS2) serving as a reference. Consequently, as the movement stroke of coarse movement stage WCS1 (or WCS2) iii the X-axis direction, the distance that is obtained by adding some margin to the predetermined range should be prepared. Such details are disclosed in, for example, U.S. Patent Application Publication No. 2008/0143994 and the like.

Further, as described earlier, since fine movement stage WFS1 is supported at the three noncollinear positions by coarse movement stage WCS1, main controller 20 can tilt fine movement stage WFS1 (i.e. wafer W) at an arbitrary angle (rotational amount) in the θx direction and/or the θy direction with respect to the XY plane by, for example, appropriately controlling a drive force (thrust) in the Z-axis direction that is made to act on each of fine movement slider sections 84a to 84c. Further, main controller 20 can make the center portion of fine movement stage WFS1 bend in the +Z direction (into a convex shape), for example, by making a drive force in the +θx direction (a counterclockwise direction on the page surface of FIG. 4B) on each of fine movement slider sections 84a and 84b and also making a drive force in the −θx direction (a clockwise direction on the page surface of FIG. 4B) on fine movement slider section 84c. Further, main controller 20 can also make the center portion of fine movement stage WFS1 bend in the +Z direction (into a convex shape), for example, by making drive forces in the −θy direction and the +θy direction (a counterclockwise direction and a clockwise direction when viewed from the +Y side, respectively) on fine movement slider sections 84a and 84b, respectively. Main controller 20 can also perform the similar operations with respect to fine movement stage WFS2.

Incidentally, in the embodiment, as fine movement stage driving systems 64A and 64B, the planar motors of a moving magnet type are used, but this is not intended to be limiting, and planar motors of a moving coil type in which the coil units are placed at the fine movement slider sections of the fine movement stages and the magnetic units are placed at the guide members of the coarse movement stages can also be used.

Between coupling member 92a of coarse movement stage WCS1 and main section 80 of fine movement stage WFS1, as shown in FIG. 4A, a pair of tubes 86a and 86b used to transmit the power usage from the outside to fine movement stage WFS1 are installed. Incidentally, although the illustration is omitted in the drawings including FIG. 4A, actually, the pair of tubes 86a and 86b are each made up of a plurality of tubes. One ends of tubes 86a and 86b are connected to the side surface on the +X side of coupling member 92a and the other ends are connected to the inside of main section 80, respectively via a pair of recessed sections 80a (see FIG. 4C) with a predetermined depth each of which is formed from the end surface on the −X side toward the +X direction with a predetermined length, on the upper surface of main section 80. As shown in FIG. 4C, tubes 86a and 86b are configured not to protrude above the upper surface of fine movement stage WFS1. Between coupling member 92a of coarse movement stage WCS2 and main section 80 of fine movement stage WFS2 as well, as shown in FIG. 2, a pair of tubes 86a and 86b used to transmit the power usage from the outside to fine movement stage WFS2 are installed.

As shown in FIG. 2, one of the tube carriers, tube carrier TCa is connected to the piping member and the wiring member inside coupling member 92a of coarse movement stage WCS1 via tube Ta$_2$. As shown in FIG. 3, tube carrier TCa is placed on a stepped section formed at the end on the −X side of base board 12. Tube carrier TCa is driven in the Y-axis direction following wafer stage WST1, by an actuator such as a liner motor, on the stepped section of base board 12.

As shown in FIG. 3, the other of the tube carriers, tube carrier TCb is placed on a stepped section formed at the end on the +X side of base board 12, and is connected to the piping member and the wiring member inside coupling member 92a of coarse movement stage WCS2 via tube Tb$_2$ (see FIG. 2). Tube carrier TCb is driven in the Y-axis direction following wafer stage WST2, by an actuator such as a liner motor, on the stepped section of base board 12.

As shown in FIG. 3, one ends of tubes Ta$_1$ and Tb$_1$ are connected to tube carriers TCa and TCb respectively, while the other ends of tubes Ta$_1$ and Tb$_1$, are connected to a power usage supplying device externally installed that is not illustrated (e.g. an electric power supply, a gas tank, a compressor, a vacuum pump or the like). The power usage supplied from the power usage supplying device to tube carrier TCa via tube Ta$_1$ is supplied to fine movement stage WFS1 via tube Ta$_2$, the piping member and the wiring member, which are not illustrated, housed in coupling member 92a of coarse movement stage WCS1, and tubes 86a and 86b. Similarly, the power usage supplied from the power usage supplying device to tube carrier TCb via tube Tb$_1$ is supplied to fine movement stage WFS2 via tube Tb$_2$, the piping member and the wiring member, which are not illustrated, housed in coupling member 92a of coarse movement stage WCS2, and tubes 86a and 86b.

Next, a measurement system that measures positional information of wafer stages WST1 and WST2 is described. Exposure apparatus 100 has a fine movement stage position measuring system 70 (see FIG. 6) to measure positional information of fine movement stages WFS1 and WFS2 and coarse movement stage position measuring systems 68A and 68B (see FIG. 6) to measure positional information of coarse movement stages WCS1 and WCS2 respectively.

Fine movement stage position measuring system 70 has a measurement bar 71 shown in FIG. 1. Measurement bar 71 is placed below first sections 14A$_1$ and 14B$_1$ that the pair of surface plates 14A and 14B respectively have, as shown in FIG. 3. As is obvious from FIGS. 1 and 3, measurement bar 71 is made up of a beam-like member having a rectangular sectional shape with the Y-axis direction serving as its longitudinal direction, and both ends in the longitudinal direction are each fixed to main frame BD in a suspended state via a suspended member 74. More specifically, main frame BD and measurement bar 71 are integrated. Incidentally, in the case where a configuration that does not block the movement of the wafer stages is employed for the beam-like member, the support method of the beam-like member is not limited to the both ends support but one end in the longitudinal direction can be cantilevered. Further, the beam-like member should be placed below base board 12 described earlier. Furthermore, while the beam-like member is supported by main frame BD, the beam-like member can be arranged on the installation surface (such as a floor surface) via a vibration isolating mechanism. In this case, it is preferable to arrange a measurement device that measures the relative positional relation between main frame BD and the beam-like Member. The beam-like member can also be referred to as a member for measurement or the like.

The +Z side half (upper half) of measurement bar 71 is placed between second section 14A$_2$ of surface plate 14A and second section 14B$_2$ of surface plate 14B, and the −Z side half (lower half) is housed inside recessed section 12a formed at base board 12. Further, a predetermined clearance is formed between measurement bar 71 and each of surface plates 14A and 14B and base board 12, and measurement bar 71 is in a state mechanically noncontact with the members other than main frame BD. Measurement bar 71 is formed by a material with a relatively low coefficient of thermal expansion (e.g. invar, ceramics, or the like). Incidentally, the shape of measurement bar 71 is not limited in particular. For example, it is also possible that the measurement member has a circular cross section (a cylindrical shape), or a trapezoidal or triangle cross section. Further, the measurement bar does not necessarily have to be formed by a longitudinal member such as a bar-like member or a beam-like member.

At measurement bar 71, as shown, in FIG. 5, a first measurement head group 72 used when measuring positional information of the fine movement stage (WFS1 or WFS2) located below projection unit PU and a second measurement head group 73 used when measuring positional information of the fine movement stage (WFS1 or WFS2) located below alignment device 99 are arranged. Incidentally, alignment systems AL1 and AL2$_1$ to AL2$_4$ are shown in virtual lines (two-dot chain lines) in FIG. 5 in order to make the drawing easy to understand. Further, in FIG. 5, the reference signs of alignment systems AL2$_1$ to AL2$_4$ are omitted.

As shown in FIG. 5, first measurement head group 72 is placed below projection unit PU and includes a one-dimensional encoder head for X-axis direction measurement (hereinafter, shortly referred to as an X head or an encoder head) 75x, a pair of one-dimensional encoder heads for Y-axis direction measurement (hereinafter, shortly referred to as Y heads or encoder heads; 75ya and 75yb, and three Z heads 76a, 76b and 76c.

X head 75x, Y heads 75ya and 75yb and the three Z heads 76a to 76c are placed in a state where their positions do not vary, inside measurement bar 71. X head 75x is placed on reference axis LV, and Y heads 75ya and 75yb are placed at the same distance apart from X head 75x, on the −X side and the +X side, respectively. In the embodiment, as each of the three encoder heads 75x, 75ya and 75yb, a diffraction interference type head having a configuration in which a light source, a photodetection system (including a photodetector) and various types of optical systems are unitized is used, which is similar to the encoder head disclosed in, for example, PCT International Publication No. 2007/083758 (the corresponding U.S. Patent Application Publication No. 2007/0288121) and the like.

When wafer stage WST1 (or WST2) is located directly under projection optical system PL (see FIG. 1), X head 75x and Y heads 75ya and 75yb each irradiate a measurement beam on grating RG (see FIG. 4B) placed on the lower surface of fine movement stage WFS1 (or WFS2), via a gap between surface plate 14A and surface plate 14B or a light-transmitting section (e.g. an opening) formed at first section $14A_1$ of surface plate 14A and first section $14B_1$ of surface plate 14B. Further, X head 75x and Y heads 75ya and 75yb each receive diffraction light from grating RG, thereby obtaining positional information within the XY plane (also including rotational information in the θz direction) of fine movement stage WFS1 (or WFS2) More specifically, an X liner encoder 51 (see FIG. 6) is configured of X head 75x that measures the position of fine movement stage WFS1 (or WFS2) in the X-axis direction using the X diffraction grating that grating RG has. And, a pair of Y liner encoders 52 and 53 (see FIG. 6) are configured of the pair of Y heads 75ya and 75yb that measure the position of fine movement stage WFS1 (or WFS2) in the Y-axis direction using the Y diffraction grating of grating RG. The measurement value of each of X head 75x and Y heads 75ya and 75yb is supplied to main controller 20 (see FIG. 6), and main controller 20 measures (computes) the position of fine movement stage WFS1 (or WFS2) in the X-axis direction using (based on) the measurement value of X head 75x, and the position of fine movement stage WFS1 (or WFS2) in the Y-axis direction based on the average value of the measurement values of the pair of Y head 75ya and 75yb. Further, main controller 20 measures (computes) the position in the θz direction (rotational amount around the Z-axis) of fine movement stage WFS1 (or WFS2) using the measurement value of each of the pair of Y linear encoders 52 and 53.

In this case, an irradiation point (detection point), on grating RG, of the measurement beam irradiated from X head 75x coincides with the exposure position that is the center of exposure area IA (see FIG. 1) on wafer W. Further, a midpoint of a pair of irradiation points (detection points), on grating RG, of the measurement beams respectively irradiated from the pair of Y heads 75ya and 75yb coincides with the irradiation point (detection point), on grating RG, of the measurement beam irradiated from X head 75x. Main controller 20 computes positional information of fine movement stage WFS1 (or WFS2) in the Y-axis direction based on the average of the measurement values of the two Y heads 75ya and 75yb. Therefore, the positional information of fine movement stage WFS1 (or WFS2) in the Y-axis direction is substantially measured, at the exposure position that is the center of irradiation area (exposure area) IA of illumination light IL irradiated on wafer. W. More specifically, the measurement center of X head 75x and the substantial measurement center of the two Y heads 75ya and 75yb coincide with the exposure position. Consequently, by using X linear encoder 51 and Y linear encoders 52 and 53, main controller 20 can perform measurement of the positional information within the XY plane (including the rotational information in the θz direction) of fine movement stage WFS1 (or WFS2) directly under (on the back side of) the exposure position at all times.

As each of Z heads 76a to 76c, for example, a head of a displacement sensor by an optical method similar to an optical pickup used in a CD drive device or the like is used The three Z heads 76a to 76c are placed at the positions corresponding to the respective vertices of an isosceles triangle (or an equilateral triangle) Z heads 76a to 76c each irradiate the lower surface of fine movement stage WFS1 (or WFS2) with a measurement beam parallel to the Z-axis from below, and receive reflected light reflected by the surface of the plate on which grating RG is formed (or the formation surface of the reflective diffraction grating). Accordingly, Z heads 76a to 76c configure a surface position measuring system 54 (see FIG. 6) that measures the surface position (position in the Z-axis direction) of fine movement stage WFS1 (or WFS2) at the respective irradiation points. The measurement value of each of the three Z heads 76a to 76c is supplied to main controller 20 (see FIG. 6).

The center of gravity of the isosceles triangle (or the equilateral triangle) whose vertices are at the three irradiation points on grating RG of the measurement beams respectively irradiated from the three Z heads 76a to 76c coincides with the exposure position that is the center of exposure area IA (see FIG. 1) on wafer W. Consequently, based on the average value of the measurement values of the three Z heads 76a to 76c, main controller 20 can acquire positional information in the Z-axis direction (surface position information) of fine movement stage WFS1 (or WFS2) directly under the exposure position at all times. Further, main controller 20 measures (computes) the rotational amount in the θx direction and the θy direction, in addition to the position in the Z-axis direction, of fine movement stage WFS1 (or WFS2) using (based on) the measurement values of the three Z heads 76a to 76c.

Figure 6:
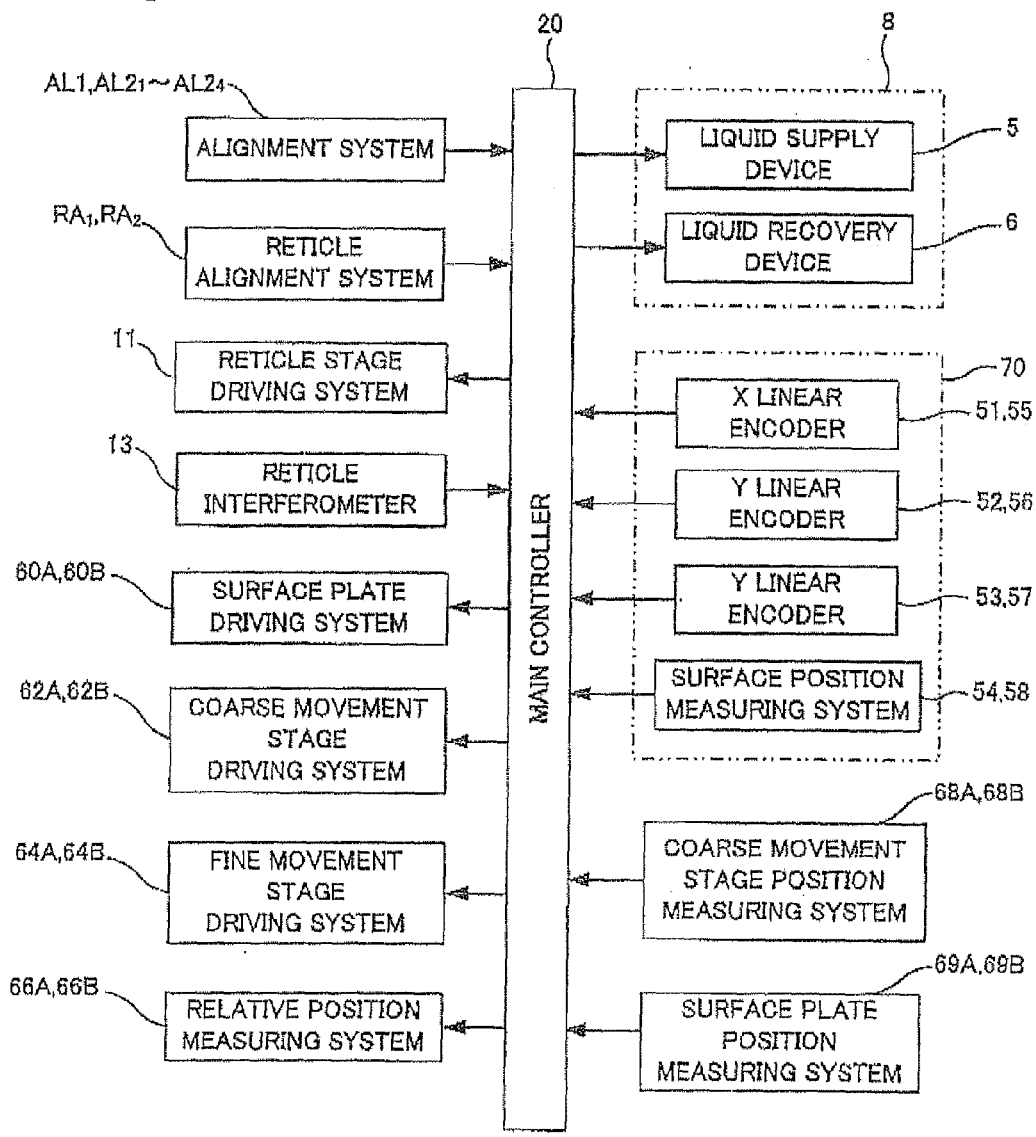

Second measurement head group 73 has an X head 77x that configures an X liner encoder 55 (see FIG. 6), a pair of heads 77ya and 77yb that configure a pair of X linear encoders 56 and 57 (see FIG. 6), and three Z heads 78a, 78b and 78o that configure a surface position measuring system 58 (see FIG. 6). The respective positional relations of the pair of Y heads 77ya and 77yb and the three Z heads 78a to 78c with X head 77x serving as a reference are similar to the respective positional relations described above of the pair of Y heads 75ya and 75yb and the three Z heads 76a to 76c with X head 75x serving as a reference. An irradiation point (detection point), on grating RG, of the measurement beam irradiated from X head 77x coincides with the detection center of primary alignment system AL1. More specifically, the measurement center of X head 77x and the substantial measurement center of the two Y heads 77ya and 77yb coincide with the detection center of primary alignment system AL1. Consequently, main controller 20 can perform measurement of positional information within the XY plane and surface position information of fine movement stage WFS2 (or WFS1) at the detection center of primary alignment system AL1 at all times.

Incidentally, while each of X heads 75x and 77x and Y heads 75ya, 75yb, 77ya and 77yb of the embodiment has the light source, the photodetection system (including the photodetector) and the various types of optical systems (none of which are illustrated) that are unitized and placed inside measurement bar 71, the configuration of the encoder head is not limited thereto. For example, the light source and the photodetection system can be placed outside the measurement bar. In such a case, the optical systems placed inside the measurement bar, and the light source and the photodetection system are connected to each other via, for example, an optical fiber or the like. Further, a configuration can also be employed in which the encoder head is placed outside the measurement bar and only a measurement beam is guided to the grating via an optical fiber placed inside the measurement bar. Further, the rotational information of the wafer in the θz direction can be measured using a pair of the X liner encoders (in this case, there should be one Y linear encoder). Further, the surface position information of the fine movement stage can be measured using, for example, an optical interferometer. Further, instead of the respective heads of first measurement head group 72 and second measurement head group 73, three encoder heads in total, which include at least one XZ encoder head whose measurement directions are the X-axis direction and the Z-axis direction and at least one YZ encoder head whose measurement directions are the Y-axis direction and the Z-axis direction, can be arranged in the placement similar to that of the X head and the pair of Y heads described earlier.

Further, measurement bar 71 can be divided into a plurality of sections. For example, it is also possible that measurement bar 71 is divided into a section having first measurement head group 72 and a section having second measurement head group 73, and the respective sections (measurement bars) detect the relative position with main frame BD, with (the measurement reference surface of) main frame BD serving as a reference and perform control such that the positional relation is constant. In this case, a head unit, which includes a plurality of encoder heads and Z heads (surface position measuring system), is arranged at both ends of the respective sections (measurement bars), and the positions in the Z-axis direction and the rotational amount in the θx and θy directions of the respective sections (measurement bars) can be computed.

When wafer stage WST1 moves between exposure station 200 and measurement station 300 on surface plate 14A, coarse movement stage position measuring system 68A (see FIG. 6) measures positional information of coarse movement stage WCS1 (wafer stage WST1). The configuration of coarse movement stage position measuring system 68A is not limited in particular, and includes an encoder system or an optical interferometer system (it is also possible to combine the optical interferometer system and the encoder system). In the case where coarse movement stage position measuring system 68A includes the encoder system, for example, a configuration can be employed in which the positional information of coarse movement stage WCS1 is measured by irradiating a scale (e.g. two-dimensional grating) fixed (or formed) on the upper surface of coarse movement stage WCS1 with measurement beams from a plurality of encoder heads fixed to main frame ED in a suspended state along the movement course of wafer stage WST1 and receiving the diffraction light of the measurement beams. In the case where coarse movement stage measuring system 68A includes the optical interferometer system, a configuration can be employed in which the positional information of wafer stage WST1 is measured by irradiating the side surface of coarse movement stage WCS1 with measurement beams from an X optical interferometer and a Y optical interferometer that have a measurement axis parallel to the X-axis and a measurement axis parallel to the Y-axis respectively and receiving the reflected light of the measurement beams.

Coarse movement stage position measuring system 68B (see FIG. 6) has the configuration similar to coarse movement stage position measuring system 68A, and measures positional information of coarse movement stage WCS2 (wafer stage WST2). Main controller 20 respectively controls the positions of coarse movement stages WCS1 and WCS2 (wafer stages WST1 and WST2) by individually controlling coarse movement stage driving systems 62A and 62B, based on the measurement values of coarse movement stage position measuring systems 68A and 68B.

Further, exposure apparatus 100 is also equipped with a relative position measuring system 66A and a relative position measuring system 66B (see FIG. 6) that measure the relative position between coarse movement stage WCS1 and fine movement stage WFS1 and the relative position between coarse movement stage WCS2 and fine movement stage WFS2, respectively. While the configuration of relative position measuring systems 66A and 66B is not limited in particular, relative position measuring systems 66A and 66B can each be configured of, for example, a gap sensor including a capacitance sensor. In this case, the gap sensor can be configured of for example, a probe section fixed to coarse movement stage WCS1 (or WCS2) and a target section fixed to fine movement stage WFS1 (or WFS2). Incidentally, the configuration of the relative position measuring system is not limited thereto, but for example, the relative position measuring system can be configured using, for example, a liner encoder system, an optical interferometer system or the like.

FIG. 6 shows a block diagram that shows input/output relations of main controller 20 that is configured of a control system of exposure apparatus 100 as the central component and performs overall control of the respective components. Main controller 20 includes a workstation (or a microcomputer) and the like, and performs overall control of the respective components of exposure apparatus 100 such as local liquid immersion device 8, surface plate driving systems 60A and 60B, coarse movement stage driving systems 62A and 62B, and fine movement stage driving systems 64A and 64B.

Next, a parallel processing operation using the two wafer stages WST1 and WST2 is described with reference to FIGS. 7 to 11. Note that during the operation below, main controller 20 controls liquid supply device 5 and liquid recovery device 6 as described earlier and a constant quantity of liquid Lq is held directly under tip lens 191 of projection optical system PL, and thereby a liquid immersion area is formed at all times.

Figure 7:
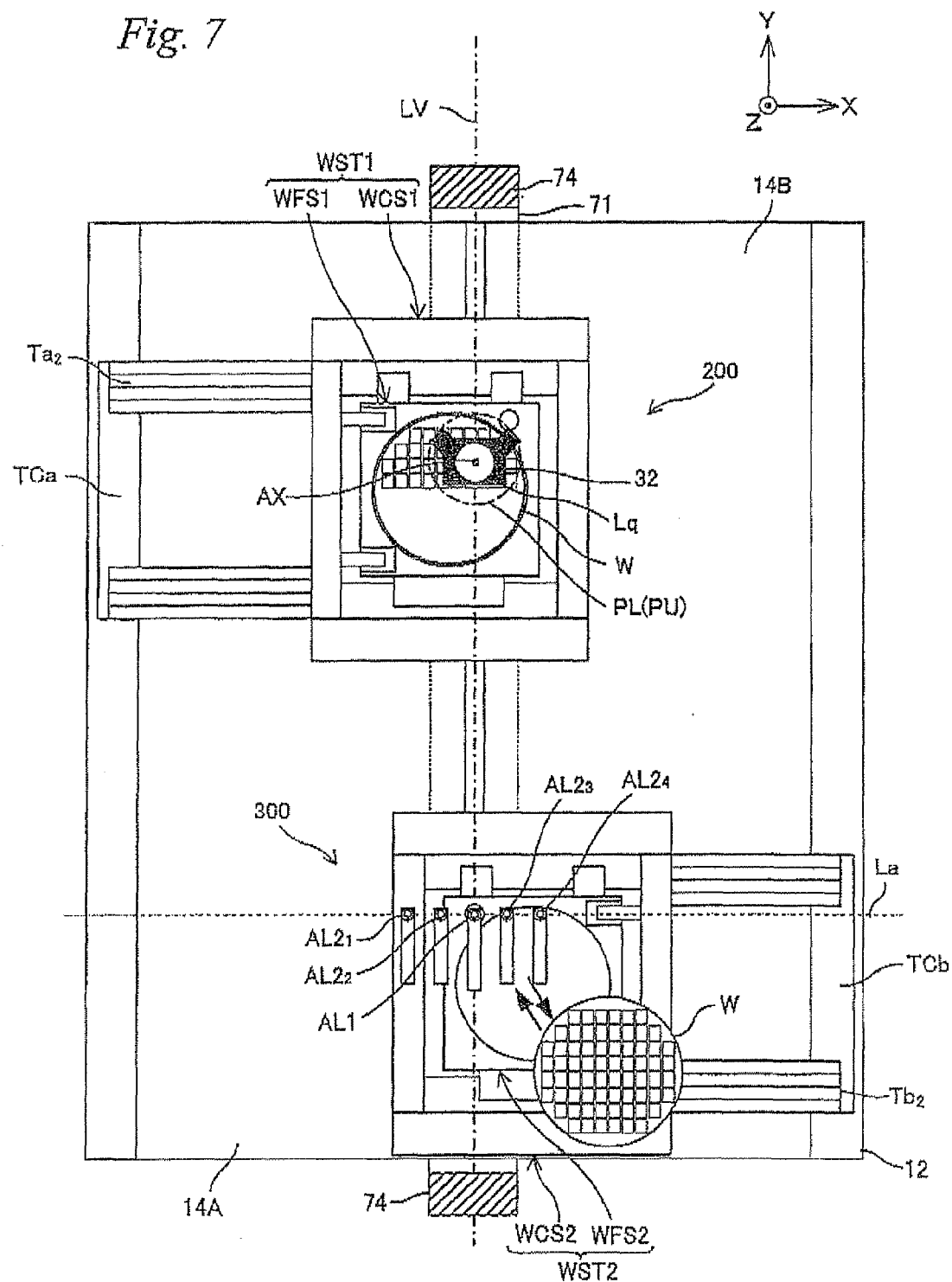
FIG. 7 is a view showing a state where exposure is performed on a wafer mounted on wafer stage WST1 and wafer exchange is performed on a wafer stage WST2.

FIG. 7 shows a state where exposure by a step-and-scan method is performed on wafer W mounted on fine movement stage WFS1 of wafer stage WST1 in exposure station 200, and in parallel with this exposure, wafer exchange is performed between a wafer carrier mechanism (not illustrated) and fine movement stage WFS2 of wafer stage WST2 at the second loading position.

Main controller 20 performs the exposure operation by a step-and-scan method by repeating an inter-shot movement (stepping between shots) operation of moving wafer stage WST1 to a scanning starting position (acceleration starting position) for exposure of each shot area on wafer W, based on the results of wafer alignment (e.g. information obtained by converting an arrangement coordinate of each shot area on wafer W obtained by an Enhanced Global Alignment (EGA) into a coordinate with the second fiducial mark on measurement plate FM1 serving as a reference) and reticle alignment and the like that have been performed beforehand, and a scanning exposure operation of transferring a pattern formed on reticle R onto each shot area on wafer W by a scanning exposure method. During this step-and-scan operation, surface plates 14A and 14B exert the function as the countermasses, as described previously, according to movement of wafer stage WST1, for example, in the Y-axis direction during scanning exposure. Further, main controller 20 gives the initial velocity to coarse movement stage WCS1 when driving fine movement stage WFS1 in the X-axis direction for the stepping operation between shots, and thereby coarse movement stage WCS1 functions as a local countermass with respect to fine movement stage WFS1. Consequently, the movement of wafer stage WST1 (coarse movement stage WCS1 and fine movement stage WFS1) does not cause vibration of surface plates 14A and 14B and does not adversely affect wafer stage WST2.

The exposure operations described above are performed in a state where liquid Lq is held in the space between tip lens 191 and wafer W (wafer W and plate 82 depending on the position of a shot area), or more specifically, by liquid immersion exposure.

In exposure apparatus 100 of the embodiment, during a series of the exposure operations described above, main controller 20 measures the position of fine movement stage WFS1 using first measurement head group 72 of fine movement stage position measuring system 70 and controls the position of fine movement stage WFS1 (wafer W) based on this measurement result.

The wafer exchange is performed by unloading a wafer that has been exposed from fine movement stage WFS2 and loading a new wafer onto fine movement stage WFS2 by the wafer carrier mechanism that is not illustrated, when fine movement stage WFS2 is located at the second loading position. In this case, the second loading position is a position where the wafer exchange is performed on wafer stage WST2, and in the embodiment, the second loading position is to be set at the position where fine movement stage WFS2 (wafer stage WST2) is located such that measurement plate FM2 is positioned directly under primary alignment system AL1.

During the wafer exchange described above, and after the wafer exchange, while wafer stage WST2 stops at the second loading position, main controller 20 executes reset (resetting of the origin) of second measurement head group 73 of fine movement stage position measuring system 70, or more specifically, encoders 55, 56 and 57 (and surface position measuring system 58), prior to start of wafer alignment (and the other pre-processing measurements) with respect to the new wafer W.

When the wafer exchange (loading of the new wafer W) and the reset of encoders 55, 56 and 57 (and surface position measuring system 58) have been completed, main controller 20 detects the second fiducial mark on measurement plate FM2 using primary alignment system AL1. Then, main controller 20 detects the position of the second fiducial mark with the index center of primary alignment system AL1 serving as a reference, and based on the detection result and the result of position measurement of fine movement stage WFS2 by encoders 55, 56 and 57 at the time of the detection, computes the position coordinate of the second fiducial mark in an orthogonal coordinate system (alignment coordinate system) with reference axis La and reference axis LV serving as coordinate axes.

Figure 8:
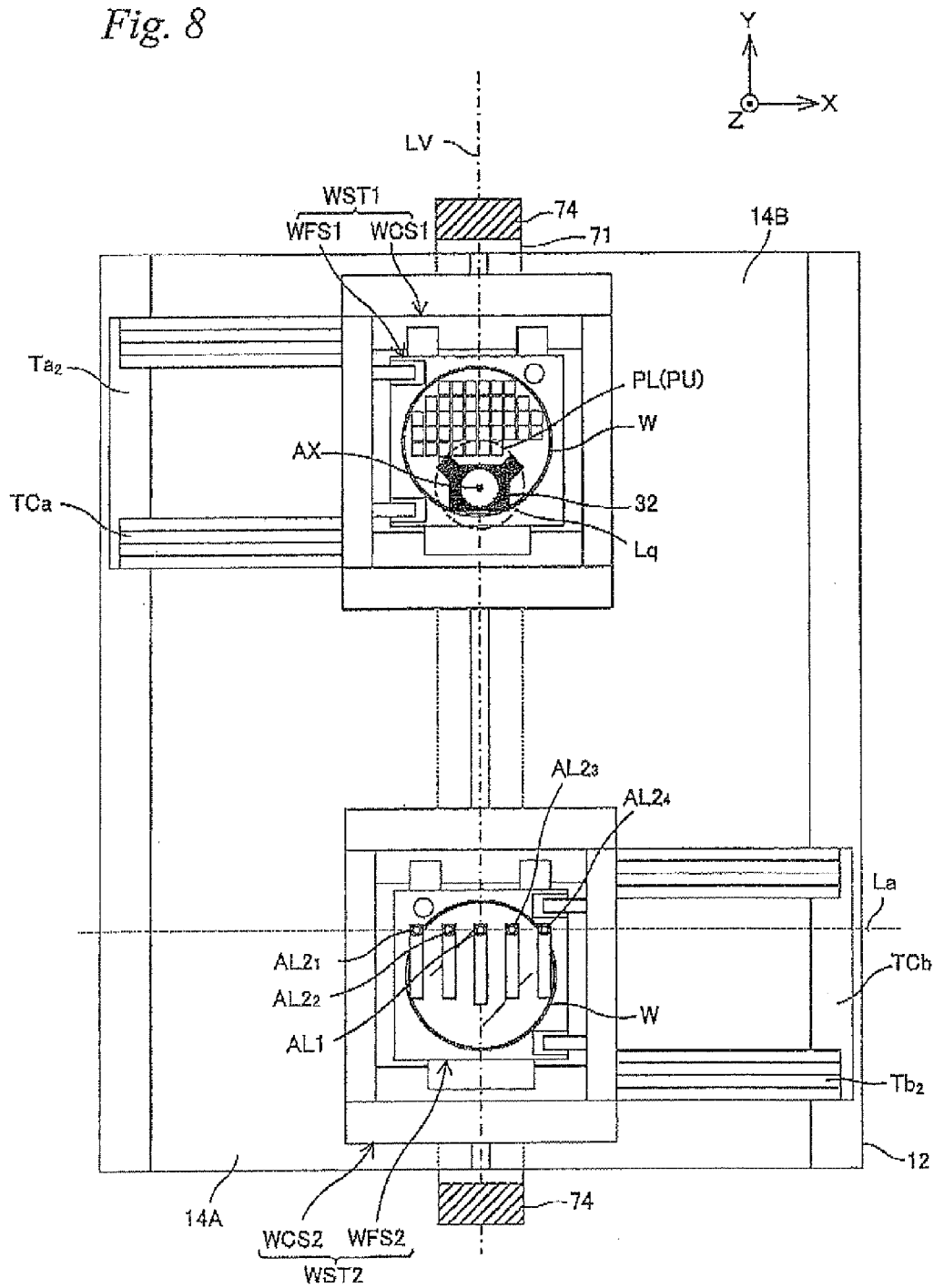
FIG. 8 is a view showing a state where exposure is performed on a wafer mounted on wafer stage WST1 and wafer alignment is performed to a wafer mounted on wafer stage WST2.

Next, main controller 20 performs the EGA while measuring the position coordinate of fine movement stage WFS2 (wafer stage WST2) in the alignment coordinate system using encoders 55, 56 and 57 (see FIG. 8). To be more specific, as disclosed in, for example, U.S. Patent Application Publication No. 2008/0088843 and the like, main controller 20 moves wafer stage WST2, or more specifically, coarse movement stage WCS2 that supports fine movement stage WFS2 in, for example, the Y-axis direction, and sets the position of fine movement stage WFS2 at a plurality of positions in the movement course, and at each position setting, detects the position coordinates, in the alignment coordinate system, of alignment marks at alignment shot areas (sample shot areas) using at least one of alignment systems AL1 and $AL2_2$ and $AL2_4$. FIG. 8 shows a state of wafer stage WST2 when the detection of the position coordinates of the alignment marks in the alignment coordinate system is performed.

In this case, in conjunction with the movement operation of wafer stage WST2 in the Y-axis direction described above, alignment systems AL1 and $AL2_2$ to $AL2_4$ respectively detect a plurality of alignment marks (sample marks) disposed along the X-axis direction that are sequentially placed within the detection areas (e.g. corresponding to the irradiation areas of detection light). Therefore, on the measurement of the alignment marks described above, wafer stage WST2 is not driven in the X-axis direction.

Then, based on the position coordinates of the plurality of alignment marks arranged at the sample shot areas on wafer W and the design position coordinates, main controller 20 executes statistical computation (EGA computation) disclosed in, for example, U.S. Pat. No. 4,780,617 and the like, and computes the position coordinates (arrangement coordinates) of the plurality of shot areas in the alignment coordinate system.

Further, in exposure apparatus 100 of the embodiment, since measurement station 300 and exposure station 200 are spaced apart, main controller 20 subtracts the position coordinate of the second fiducial mark that has previously been detected from the position coordinate of each of the shot areas on wafer W that has been obtained as a result of the wafer alignment, thereby obtaining the position coordinates of the plurality of shot areas on wafer W with the position of the second fiducial mark serving as the origin.

Normally, the above-described wafer exchange and wafer alignment sequence is completed earlier than the exposure sequence. Therefore, when the wafer alignment has been completed, main controller 20 drives wafer stage WST2 in the +X direction to move wafer stage WST2 to a predetermined standby position on surface plate 14B. In this case, when wafer stage WST2 is driven in the +X direction, fine movement stage WFS2 goes out of a measurable range of fine movement stage position measuring system 70 (i.e. the respective measurement beams irradiated from second measurement head group 73 move off from grating RG). Therefore, based on the measurement values of fine movement stage position measuring system 70 (encoders 55, 56 and 57) and the measurement values of relative position measuring system 66B, main controller 20 obtains the position of coarse movement stage WCS2, and afterward, controls the position of wafer stage WST2 based on the measurement values of coarse movement stage position measuring system 68B. More specifically, position measurement of wafer stage WST2 within the XY plane is switched from the measurement using encoders 55, 56 and 57 to the measurement using coarse movement stage position measuring system 68B. Then, main controller 20 makes wafer stage WST2 wait at the predetermined standby position described above until exposure on wafer W on fine movement stage WFS1 is completed.

Figure 9:
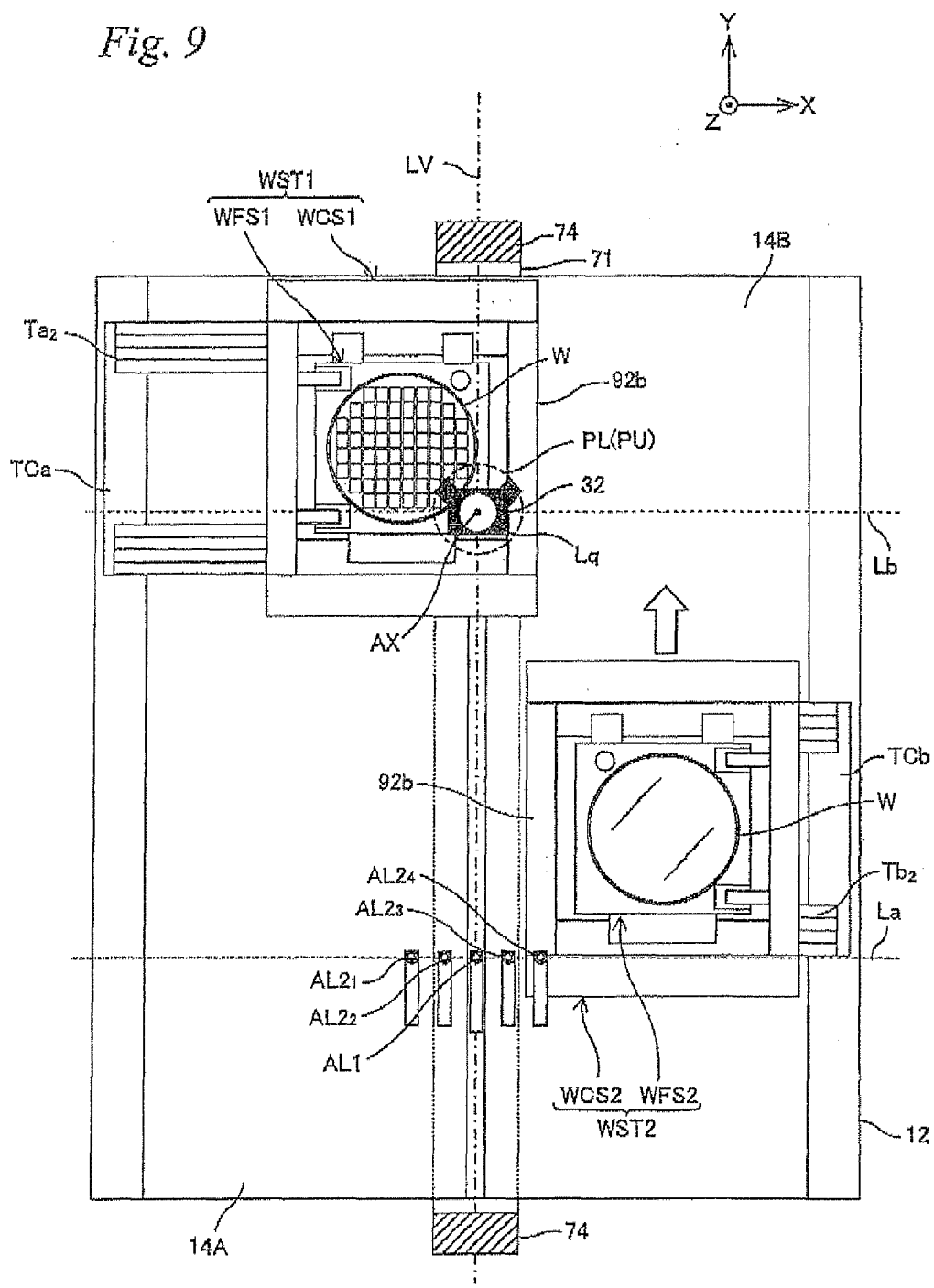
FIG. 9 is a view showing a state where wafer stage WST2 moves toward a right-side scrum position on a surface plate 14B.
Figure 10:
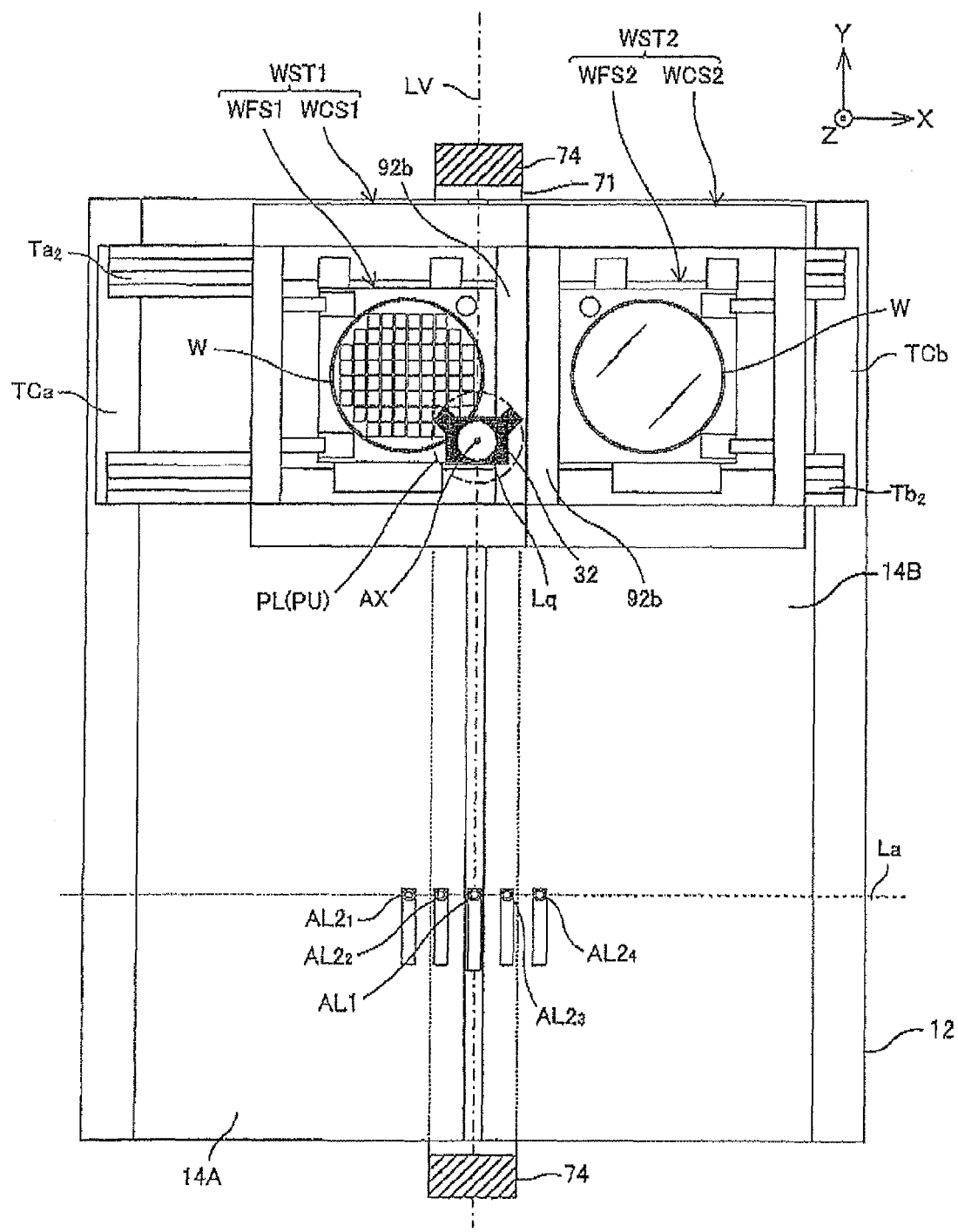
FIG. 10 is a view showing a state where movement of wafer stage WST1 and wafer stage WST2 to the scrum position is completed.

When the exposure on wafer W on fine movement stage WFS1 has been completed, main controller 20 starts to drive wafer stages WST1 and WST2 severally toward a right-side scrum position shown in FIG. 10. When wafer stage WST1 is driven in the −X direction toward the right-side scrum position, fine movement stage WFS1 goes out of the measurable range of fine movement stage position measuring system 70 (encoders 51, 52 and 53 and surface position measuring system 54) (i.e. the measurement beams irradiated from first measurement head group 72 move off from grating RG). Therefore, based on the measurement values of fine movement stage position measuring system 70 (encoders 51, 52 and 53) and the measurement values of relative position measuring system 66A, main controller 20 obtains the position of coarse movement stage WCS1, and afterward, controls the position of wafer stage WST1 based on the measurement values of coarse movement stage position measuring system 68A. More specifically, main controller 20 switches position measurement of wafer stage WST1 within the XY plane from the measurement using encoders 51, 52 and 53 to the measurement using coarse movement stage position measuring system 68A. During this operation, main controller 20 measures the position of wafer stage WST2 using coarse movement stage position measuring system 68B, and based on the measurement result, drives wafer stage WST2 in the +Y direction (see an outlined arrow in FIG. 9) on surface plate 14B, as shown in FIG. 9. Owing to the action of a reaction force of this drive force of wafer stage WST2, surface plate 14B functions as the countermass.

Further, in parallel with the movement of wafer stages WST1 and WST2 toward the right-side scrum position described above, main controller 20 drives fine movement stage WFS1 in the +X direction based on the measurement values of relative position measuring system 66A and causes fine movement stage WFS1 to be in proximity to or in contact with coarse movement stage WCS1, and also drives fine movement stage WFS2 in the −X direction based on the measurement values of relative position measuring system 668 and causes fine movement stage WFS2 to be in proximity to or in contact with coarse movement stage WCS2.

Then, in a state where both wafer stages WST1 and WST2 have moved to the right-side scrum position, wafer stage WST1 and wafer stage WST2 go into a scrum state of being in proximity or in contact in the X-axis direction, as shown in FIG. 10. Simultaneously with this state, fine movement stage WFS1 and coarse movement stage WCS1 go into a scrum state, and coarse movement stage WCS2 and fine movement stage WFS2 go into a scrum state. Then, the upper surfaces of fine movement stage WFS1, coupling member 92b of coarse movement stage WCS1, coupling member 92b of coarse movement stage WCS2 and fine movement stage WFS2 form a fully flat surface that is apparently integrated.

As wafer stages WST1 and WST2 move in the −X direction while the three scrum states described above are kept, the liquid immersion area (liquid Lq) formed between tip lens 191 and fine movement stage WFS1 sequentially moves onto fine movement stage WFS1, coupling member 92b of coarse movement stage WCS1, coupling member 92b of coarse movement stage WCS2, and fine movement stage WFS2. FIG. 10 shows a state just before starting the movement of the liquid immersion area (liquid Lq). Note that in the case where wafer stage WST1 and wafer stage WST2 are driven while the above-described three scrum states are kept, it is preferable that a gap (clearance) between wafer stage WST1 and wafer stage WST2, a gap (clearance) between fine movement stage WFS1 and coarse movement stage WCS1 and a gap (clearance) between coarse movement stage WCS2 and fine movement stage WFS2 are set such that leakage of liquid Lq is prevented or restrained. In this case, the proximity includes the case where the gap (clearance) between the two members in the scrum state is zero, or more specifically, the case where both the members are in contact.

When the movement of the liquid immersion area (liquid Lq) onto fine movement stage WFS2 has been completed, wafer stage WST1 has moved onto surface plate 14A. Then, main controller 20 moves wafer stage WST1 in the −Y direction and further in the +X direction on surface plate 14A, while measuring the position of wafer stage WST1 using coarse movement stage position measuring system 68A, so as to move wafer stage WST1 to the first loading position shown in FIG. 11. In this case, on the movement of wafer stage WST1 in the −Y direction, surface plate 14A functions as the countermass owing to the action of a reaction force of the drive force. Further, when wafer stage WST1 moves in the +X direction, surface plate 14A can be made to function as the countermass owing to the action of a reaction force of the drive force.

After wafer stage WST1 has reached the first loading position, main controller 20 switches position measurement of wafer stage WST1 within the XY plane from the measurement using coarse movement stage position measuring system 68A to the measurement using encoders 55, 56 and 57.

In parallel with the movement of wafer stage WST1 described above, main controller 20 drives wafer stage WST2 and sets the position of measurement plate FM2 at a position directly under projection optical system PL. Prior to this operation, main controller 20 has switched position measurement of wafer stage WST2 within the XY plane from the measurement using coarse movement stage position measuring system 68B to the measurement using encoders 51, 52 and 53. Then, the pair of first fiducial marks on measurement plate FM2 are detected using reticle alignment systems $RA_1$ and $RA_2$ and the relative position of projected images, on the wafer, of the reticle alignment marks on reticle R that correspond to the first fiducial marks are detected. Note that this detection is performed via projection optical system PL and liquid Lq that forms the liquid immersion area.

Based on the relative positional information detected as above and the positional information of each of the shot areas on wafer W with the second fiducial mark on fine movement stage WFS2 serving as a reference that has been previously obtained, main controller 20 computes the relative positional relation between the projection position of the pattern of reticle R (the projection center of projection optical system PL) and each of the shot areas on wafer W mounted on fine movement stage WFS2. While controlling the position of fine movement stage WFS2 (wafer stage WST2) based on the computation results, main controller 20 transfers the pattern of reticle R onto each shot area on wafer W mounted on fine movement stage WFS2 by a step-and-scan method, which is similar to the case of wafer W mounted on fine movement stage WFS1 described earlier. FIG. 11 shows a state where the pattern of reticle R is transferred onto each shot area on wafer W in this manner.

In parallel with the above-described exposure operation on wafer W on fine movement stage WFS2, main controller 20 performs the wafer exchange between the wafer carrier mechanism (not illustrated) and wafer stage WST1 at the first loading position and mounts a new wafer W on fine movement stage WFS1. In this case, the first loading position is a position where the wafer exchange is performed on wafer stage WST1, and in the embodiment, the first loading position is to be set at the position where fine movement stage WFS1 (wafer stage WST1) is located such that measurement plate FM1 is positioned directly under primary alignment system AL1.

Then, main controller 20 detects the second fiducial mark on measurement plate FM1 using primary alignment system AL1. Note that, prior to the detection of the second fiducial mark, main controller 20 executes reset (resetting of the origin) of second measurement head group 73 of fine movement stage position measuring system 70, or more specifically, encoders 55, 56 and 57 (and surface position measuring system 58), in a state where wafer stage WST1 is located at the first loading position. After that, main controller 20 performs wafer alignment (EGA) using alignment systems AL1, $AL2_1$ to $AL2_4$, which is similar to the above-described one, with respect to wafer W on fine movement stage WFS1, while controlling the position of wafer stage WST1.

When the wafer alignment (EGA) with respect to wafer W on fine movement stage WFS1 has been completed and also the exposure on wafer W on fine movement stage WFS2 has been completed, main controller 20 drives wafer stages WST1 and WST2 toward a left-side scrum position. This left-side scrum position indicates a positional relation in which wafer stages WST1 and WST2 are located at positions that are bilaterally symmetric with the positions of the wafer stages in the right-side scrum position shown in FIG. 10, with respect to reference axis LV described above. Measurement of the position of wafer stage WST1 during the drive toward the left-side scrum position is performed in a similar procedure to that of the position measurement of wafer stage WST2 described earlier.

At this left-side scrum position as well, wafer stage WST1 and wafer stage WST2 go into the scrum state described earlier, and concurrently with this state, fine movement stage WFS1 and coarse movement stage WCS1 go into the scrum state and coarse movement stage WCS2 and fine movement stage WFS2 go into the scrum state. Then, the upper surfaces of fine movement stage WFS1, coupling member 92b of coarse movement stage WCS1, coupling member 92b of coarse movement stage WCS2 and fine movement stage WFS2 form a fully flat surface that is apparently integrated.

Main controller 20 drives wafer stages WST1 and WST2 in the +X direction that is reverse to the previous direction, while keeping the three scrum states described above. According this drive, the liquid immersion area (liquid Lq) formed between tip lens 191 and fine movement stage WFS2 sequentially moves onto fine movement stage WFS2, coupling member 92b of coarse movement stage WCS2, coupling member 92b of coarse movement stage WCS1 and fine movement stage WFS1, which is reverse to the previously described order. As a matter of course, also when the wafer stages are moved while the scrum states are kept, the position measurement of wafer stages WST1 and WST2 is performed, similarly to the previously described case. When the movement of the liquid immersion area (liquid Lq) has been completed, main controller 20 starts exposure on wafer W on wafer stage WST1 in the procedure similar to the previously described procedure. In parallel with this exposure operation, main controller 20 drives wafer stage WST2 toward the second loading position in a manner similar to the previously described manner, exchanges wafer W that has been exposed on wafer stage WST2 with a new wafer W, and executes the wafer alignment with respect to the new wafer W.

After that, main controller 20 repeatedly executes the parallel processing operations using wafer stages WST1 and WST2 described above.

As described above, according to exposure apparatus 100 of the embodiment, wafer stage WST1 (or WST2) in which coarse movement stage WCS1 (or WCS2) is placed on the periphery of fine movement stage WFS1 (or WFS2) is employed, wafer stages WST1 and WST2 can be reduced in size in the height direction (Z-axis direction), compared with a wafer stage that has a coarse/fine movement configuration in which a fine movement stage is mounted on a coarse movement stage. Therefore, the distance in the Z-axis direction between the point of action of the thrust of the planar motors that configure coarse movement stage driving systems 64A and 64B (i.e. the point between the bottom surface of coarse movement stage WCS1 (WCS2) and the upper surfaces of surface plates 14A and 14B) and the center of gravity of wafer stages WST1 and WST2 can be decreased, and accordingly, the pitching moment (or the rolling moment) generated when wafer stages WST1 and WTS2 are driven can be reduced. Consequently, the operations of wafer stages WST1 and WST2 become stable.

Further, according to exposure apparatus 100 of the embodiment, first measurement head group 72 and second measurement head group 73 fixed to measurement bar 71 are respectively used when the positional information (the positional information within the XY plane and the surface position information) of fine movement stage WFS1 (or WFS2) that holds wafer W are obtained, during the exposure operation and during the wafer alignment (mainly, during the measurement of the alignment marks). And, encoder heads 75x, 75ya and 75yb and Z heads 76a to 76c that configure first measurement head group 72, and encoder heads 77x, 77ya and 77yb and Z heads 78a to 78c that configure second measurement head, group 73 can respectively irradiate grating RG placed on the bottom surface of fine movement stage WFS1 (or WFS2) with measurement beams from directly below at the shortest distance. Therefore, measurement error caused by temperature fluctuation of the surrounding atmosphere of wafer stage WST1 or WST2, e.g., air fluctuation is reduced, and the positional information of fine movement stage WFS can be obtained with high precision.

Further, first measurement head group 72 measures the positional information within the XY plane and the surface position information of fine movement stage WFS1 (or WFS2) at the point that substantially coincides with the exposure position that is the center of exposure area IA on wafer W, and second measurement head group 73 measures the positional information within the XY plane and the surface position information of fine movement stage WFS2 (or WFS1) at the point that substantially coincides with the center of the detection area of primary alignment system AL1. Consequently, occurrence of the so-called Abbe error caused by the positional error within the XY plane between the measurement point and the exposure position is restrained, and also in this regard, the positional information of fine movement stage WFS1 of WFS2 can be obtained with high precision.

Further, since measurement bar 71 that has first measurement head group 72 and second measurement head group 73 is fixed in a suspended state to main frame BD to which barrel 40 is fixed, it becomes possible to perform high-precision position control of wafer stage WST1 (or WST2) with the optical axis of projection optical system PL held by barrel 40 serving as a reference. Further, since measurement bar 71 is in a mechanically noncontact state with the members (e.g. surface plates 14A and 14B, base board 14, and the like) other than main frame BD, vibration or the like generated when surface plates 14A and 14B, wafer stages WST1 and WST2, and the like are driven does not travel. Consequently, the positional information of wafer stage WST (or WST2) can be obtained with high precision by using first measurement head group 72 and second measurement head group 73.

Further, in exposure apparatus 100 of the embodiment, the surface plate that sets the guide surface used when wafer stages WST1 and WST2 move along the XY plane is configured of the two surface plates 14A and 14B so as to correspond to the two wafer stages WST1 and WST2. These two surface plates 14A and 14B independently function as the countermasses when wafer stages WST1 and WST2 are driven by the planar motors (coarse movement stage driving systems 62A and 62B), and therefore, for example, even when wafer stage WST1 and wafer stage WST2 are respectively driven in directions opposite to each other in the Y-axis direction on surface plates 14A and 14B, surface plates 14A and 14B can individually cancel the reaction forces respectively acting on the surface plates.

Incidentally, the configurations of the wafer stages and the like in the embodiment above are examples, and the present invention is not limited thereto. In the description below, some modified examples of the embodiment above are described focusing on wafer stages. Note that, in the following modified examples, for the sake of simplification of the description and for the sake of convenience of illustration in the drawings, one of the two wafer stages is described (the other wafer stage has a similar configuration), and the description and illustration of the configurations of the exposure station, the measurement station, the surface plates, the measurement system and the like are omitted. Further, the same or similar reference signs are to be used for the components same as or similar to those in the embodiment described earlier.

Further, while the wafer stage related to each of the following modified examples is composed of a fine movement stage with a rectangular tabular shape, and a coarse movement stage that is formed into a rectangular frame shape having an opening section that penetrates in the Z-axis direction in the center portion and encloses the fine movement stage, similar to the embodiment above, a configuration of a drive system used to drive the fine movement stage on the coarse movement stage is different from that in the embodiment above.

Figure 12A:
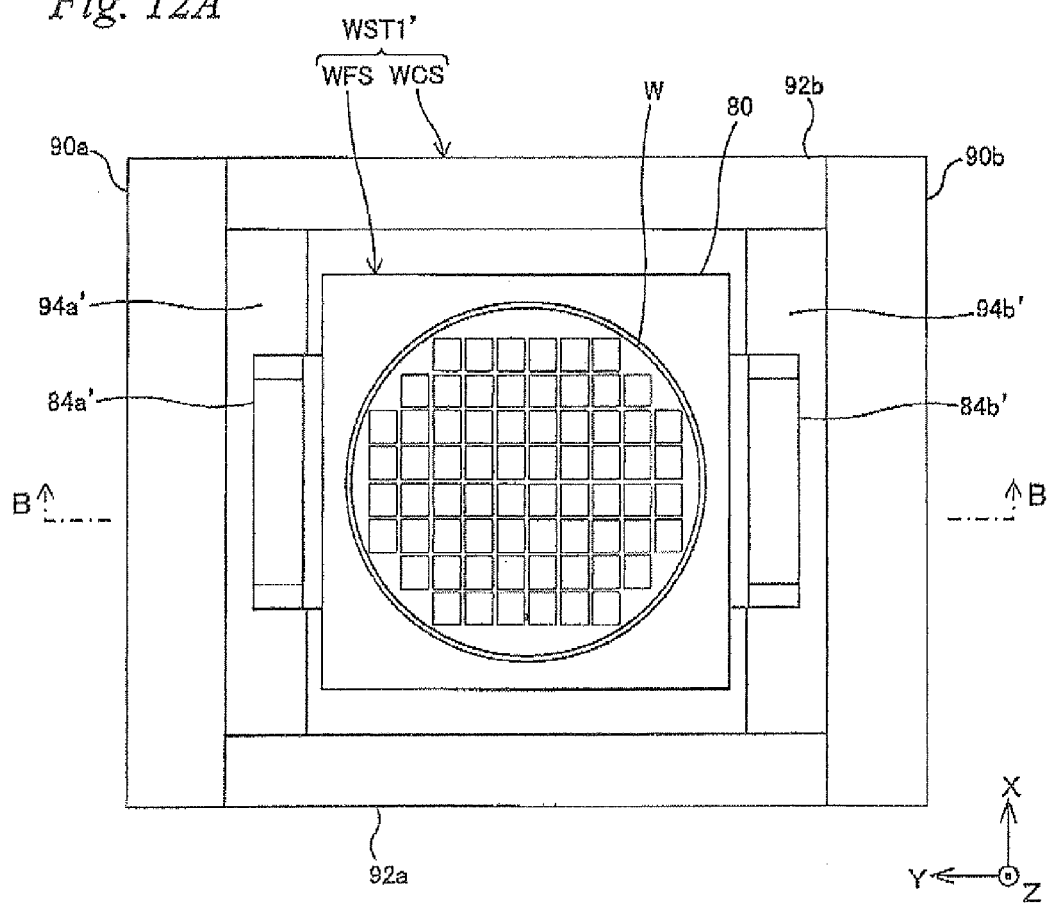
FIG. 12A is a plan view showing a wafer stage related to a first modified example.
Figure 12B:
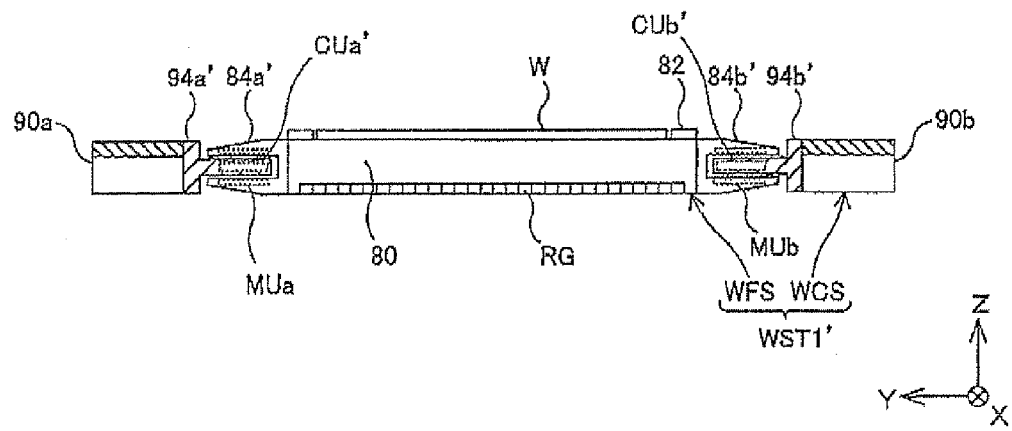
FIG. 12B is an end view of the cross section taken along the B-B line of FIG. 12A.

FIG. 12A shows a plan view of a wafer stage WST1' related to a first modified example, and FIG. 12B shows an end view of the cross section taken along the B-B line of FIG. 12A. In wafer stage WST1 (see FIGS. 4A to 9C) related to the embodiment above, the configuration is employed in which fine movement stage WFS1 is driven by the planar motor with respect to coarse movement stage WCS1, whereas in wafer stage WST1' related to the first modified example, fine movement stage WFS is driven by the linear motor with respect to coarse movement stage WCS, which is different from the embodiment above.

As shown in FIG. 12A, in wafer stage WST1', stator sections 94a' and 94b' each having a T-like sectional shape are respectively fixed to a pair of coarse movement slider sections 90a and 90b of coarse movement stage WCS. In stator sections 94a' and 94b', coil units CUa' and CUb' each including a plurality of coils are housed as shown in FIG. 12B.

On the side surface on the +Y side and the side surface on the −Y side of fine movements stage WFS, as shown in FIG. 12B, mover sections 84a' and 84b' each having a U-like sectional shape are respectively fixed. A pair of opposed surfaces of mover section 84a' that are opposed to each other, and a pair of opposed surfaces of 84b' that are opposed to each other, magnetic units MUa and MUb each including a plurality of magnets are respectively placed, and stator sections 94a' and 94b' described above are inserted between the pair of opposed surfaces of mover sections 84a' and between the pair of opposed surfaces of 84b', respectively.

In this case, coil units CUa' and Cub' housed in stator sections 94a' and 94b' respectively include an X drive coil used to drive mover section 84a' and an X drive coil used to drive mover section 84b' and a Y drive coil used to drive mover section 84a' and a Y drie coil used to drive mover section 84b'. Magnetic units MUa and MUb of mover sections 84a' and 84b' have magnets that respectively correspond to the X drive coils, the Y drive coils and Z drive coils. The X drive coils and the corresponding magnets configure an X linear motor that drive fine movement stage WFS in the X-axis direction, and the Y drive coils and the corresponding magnets configure a Y linear motor that drives fine movement stage WFS in the Y-axis direction. Either of the X drive coils and the Y drive coils that are predetermined, for example, the X drive coils also serve as the Z drive coils, and therefore, the X linear motor is capable of driving mover sections 84a' and 84b' also in the Z-axis direction.

Similarly to the wafer stage in the embodiment above, wafer stage WST' related to the first modified example is also configured such that fine movement stage WFS can be driven with a long stroke in the X-axis direction on coarse movement stage WCS and fine movement stage WFS can also be driven in directions of the other five degrees of freedom (Y, Z, θx, θy and θz directions). Incidentally, one of the mover sections (magnetic units) can be divided into two as in the embodiment above. In such a case, the fine movement stage can be bent, similarly to the embodiment above.

Figure 13A:
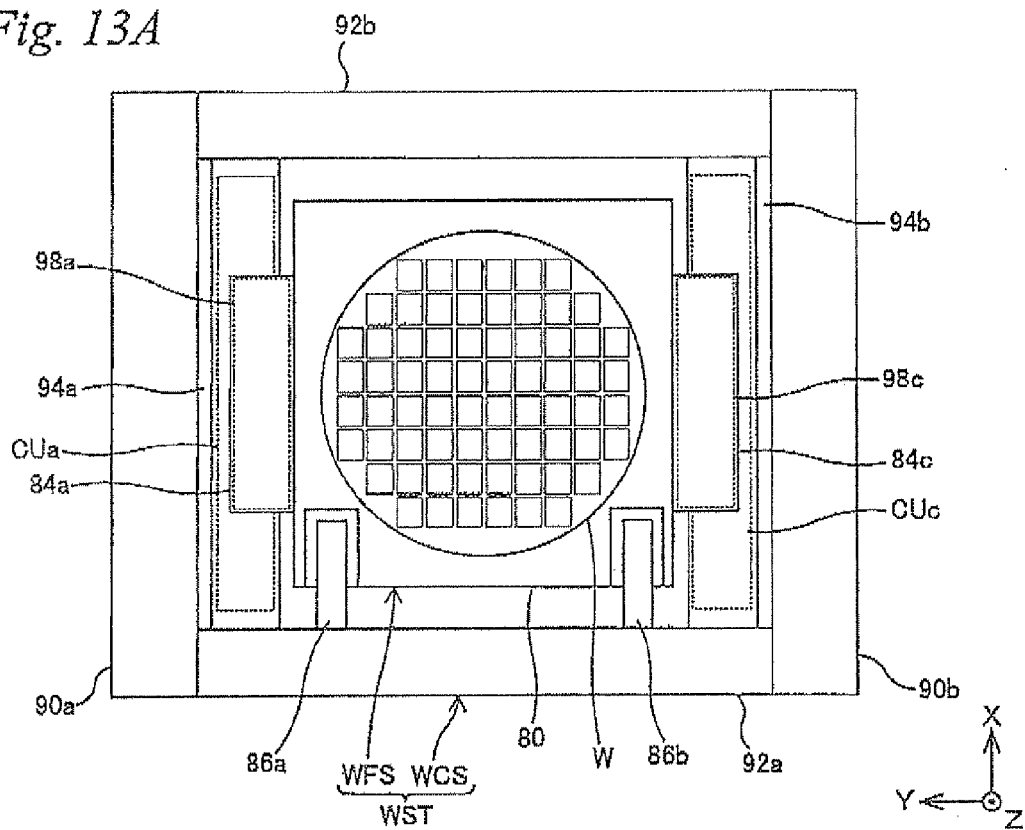
FIG. 13A is a plan view showing a wafer stage related to a second modified example.
Figure 13B:
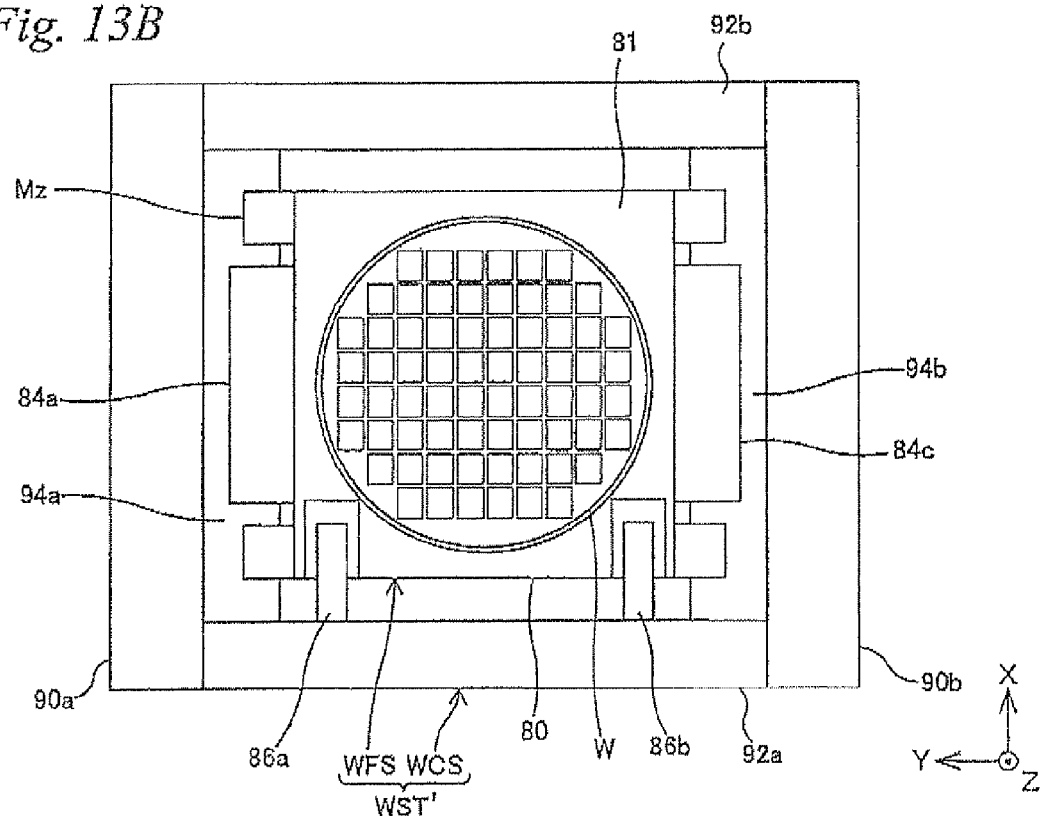
FIG. 13B is a plan view showing a wafer stage related to a third modified example.

Further, FIG. 13A shows a wafer stage WST related to a second modified example, and FIG. 13B shows a wafer stage WST' related to a third modified example, respectively in a plan view.

Wafer stage WST related to the second modified example is different in a point that only one mover section 84a is fixed on the +Y side of fine movement stage WFS, from the embodiment above in which the two mover sections 84a and 84b are fixed. Corresponding to mover section 84a, a guide member 99a placed on the +Y side has one magnetic unit 98a. In wafer stage WST of the second modified example as well, fine movement stage WFS can be driven on coarse movement stage WCS in the directions of six degrees of freedom.

In wafer stage WST' related to the third modified example shown in FIG. 13B, as a pair of planar motors that are respectively composed of stator sections 94a and 94b of coarse movement stage WCS and mover sections 84a and 84c of fine movement stage WFS, two-axial planar motors that are capable of generating drive forces only in the X-axis direction and the Y-axis direction are used, and a total of four Z drive motors Mz to drive fine movement stage WFS in the Z-axis direction are placed at four corner positions of fine movement stage WFS respectively. Z drive motors Mz are composed of the coil units (the illustration is omitted) housed in stator sections 94a and 94b of coarse movement stage WCS and magnetic units respectively fixed to the four corner portions of fine movement stage WFS. The four Z drive motors Mz are each capable of individually generating the thrust, and the rotational amount in the θx direction and the θy direction of fine movement stage WFS is controlled by the four Z drive motors Mz. Incidentally, while wafer stage WST' of the third modified example shown in FIG. 13B has the four Z drive motors, the Z drive motors should be placed at three noncollinear positions.

Further, while the exposure apparatus of the embodiment above has the two surface plates corresponding to the two wafer stages, the number of the surface plates is not limited thereto, and one surface plate or three or more surface plates can be employed. Further, the number of the wafer stages is not limited to two, but one wafer stage or three or more wafer stages can be employed, and a measurement stage, which has an aerial image measuring instrument, an uneven illuminance measuring instrument, an illuminance monitor, a wavefront aberration measuring instrument and the like, can be placed on the surface plate, as disclosed in, for example, U.S. Patent Application Publication No. 2007/0201010.

Further, in the embodiment above, while both ends of measurement bar 71 are supported in a suspended manner by main frame BD, this is not intended to be limiting, and the mid portion (which can be arranged at a plurality of positions) in the longitudinal direction of measurement bar 71 can be supported on the base board by an empty-weight canceller as disclosed in, for example, U.S. Patent Application Publication No. 2007/0201010.

Further, the motor to drive surface plates 14A and 14B on base board 12 is not limited to the planar motor by the electromagnetic force (Lorentz force) drive method, but for example, can be a planar motor (or a linear motor) by a variable magnetoresistance drive method. Further, the motor is not limited to the planar motor, but can be a voice coil motor that includes a mover fixed to the side surface of the surface plate and a stator fixed to the base board. Further, the surface plates can be supported on the base board via the empty-weight canceller as disclosed in, for example, U.S. Patent Application Publication No. 2007/0201010 and the like. Further, the drive directions of the surface plates are not limited to the directions of six degrees of freedom, but for example, can be only the Y-axis direction or only the XY two-axial directions. In this case, the surface plates can be levitated above the base board by static gas bearings (e.g. air bearings) or the like. Further, in the case where the movement direction of the surface plates can be only the Y-axis direction, the surface plates can be mounted on, for example, a Y guide member arranged extending in the Y-axis direction so as to be movable in the Y-axis direction.

Further, in the embodiment above, while the grating is placed on the lower surface of the fine movement stage, i.e., the surface that is opposed to the upper surface of the surface plate, this is not intended to be limiting, and the main section of the fine movement stage is made up of a solid member that can transmit light, and the grating can be placed on the upper surface of the main section. In this case, since the distance between the wafer and the grating is closer compared with the embodiment above, the Abbe error, which is caused by the difference in the Z-axis direction between the surface subject to exposure of the wafer that includes the exposure point and the reference surface (the placement surface of the grating) of position measurement of the fine movement stage by encoders 51, 52 and 53, can be reduced. Further, the grating can be formed on the back surface of the wafer holder. In this case, even if the wafer holder expands or the attachment position with respect to the fine movement stage shifts during exposure, the position of the wafer holder (wafer) can be measured according to the expansion or the shift.

Further, in the embodiment above, while the case has been described as an example where the encoder system is equipped with the X head and the pair of Y heads, this is not intended to be limiting, and for example, one or two two-dimensional heads) (2D head(s)) whose measurement directions are the two directions that are the X-axis direction and the Y-axis direction can be placed inside the measurement bar. In the case of arranging the two 2D heads, their detection points can be set at the two points that are spaced apart in the X-axis direction at the same distance from the exposure position as the center, on the grating. Further, in the embodiment above, while the number of heads per head group is the one X head and the two Y heads, the number of the heads can be further be increased. Moreover, first measurement head group 72 on the exposure station 200 side can further have a plurality of head groups. For example, on each of the sides (the four directions that are the +X, +Y, −X and −Y directions) on the periphery of the head group placed at the position corresponding to the exposure position (a shot area being exposed on wafer W), another head group can be arranged. And, the position of the fine movement stage (wafer W) just before exposure of the shot area can be measured in a so-called read-ahead manner. Further, the configuration of the encoder system that configures fine movement stage position measuring system 70 is not limited, to the one in the embodiment above and an arbitrary configuration can be employed. For example, a 3D head can also be used that is capable of measuring the positional information in each direction of the X-axis, the Y-axis and the Z-axis.

Further, in the embodiment above, the measurement beams emitted from the encoder heads and the measurement beams emitted from the Z heads are irradiated on the gratings of the fine movement stages via a gap between the two surface plates or the light-transmitting section formed at each of the surface plates. In this case, as the light-transmitting section, holes each of which is slightly larger than a beam diameter of each of the measurement beams are formed at each of surface plates 14A and 14B taking the movement range of surface plate 14A or 14B as the countermass into consideration, and the measurement beams can be made to pass through these multiple opening sections. Further, for example, it is also possible that pencil-type heads are used as the respective encoder heads and the respective Z heads, and opening sections in which these heads are inserted are formed at each of the surface plates.

Incidentally, the position of the border line that separates the surface plate or the base member into a plurality of sections is not limited to the position as in the embodiment above. While the border line is set so as to include reference axis LV and intersect optical axis AX in the embodiment above, the border line can be set at another position, for example, in the case where, if the boundary is located in the exposure station, the thrust of the planar motor at the portion where the boundary is located weakens.

Further, in the embodiment above, the case has been described where the liquid immersion area (liquid Lq) is constantly maintained below projection optical system PL by delivering the liquid immersion area (liquid Lq) between fine movement stage WFS1 and fine movement stage WFS2 via coupling members 92b that coarse movement stages WCS1 and WCS2 are respectively equipped with. However, this is not intended to be limiting, and it is also possible that the liquid immersion area (liquid Lq) is constantly maintained below projection optical system PL by moving a shutter member (not illustrated) having a configuration similar to the one disclosed in, for example, the third embodiment of U.S. Patent Application Publication No. 2004/0211920, to below projection optical system PL in exchange, of wafer stages WST1 and WST2.

Incidentally, in the embodiment above, the case has been described as an example where according to employment of the planar motors as coarse movement stage driving systems 62A and 62B that drive wafer stages WST1 and WST2, the guide surface (the surface that generates the force in the Z-axis direction) used on the movement of wafer stages WST1 and WST2 along the XY plane is formed by surface plates 14A and 14B that have the stator sections of the planar motors. However, the present invention is not limited thereto. For example, a configuration can be employed in which the guide of coarse movement stage WCS1 (or WCS2) in the Z-axis direction is performed using air bearings or the like. In such a case, for example, a configuration can be employed in which air pads are arranged on the side of coarse movement stage WCS1 (or WCS2) that is opposed to surface plate 14A (or surface plate 14B).

Further, in the embodiment above, while the measurement surface (grating RG) is arranged on fine movement stages WFS1 and WFS2 and first measurement head group 72 (and second measurement head group 73) composed of the encoder heads (and the Z heads) is arranged at measurement bar 71, the present invention is not limited thereto. More specifically, reversely to the above-described case, the encoder heads (and the Z heads) can be arranged at fine movement stage WFS1 and the measurement surface (grating RG) can be formed on the measurement bar 71 side. Such a reverse placement can be applied to a stage device that has a configuration in which a magnetic levitated stage is combined with a so-called H-type stage, which is employed in, for example, an electron beam exposure apparatus, an EUV exposure apparatus or the like. In this stage device, since a stage is supported by a guide bar, a scale bar (which corresponds to the measurement bar on the surface of which a diffraction grating is formed) is placed below the stage so as to be opposed to the stage, and at least a part (such as an optical system) of an encoder head is placed on the lower surface of the stage that is opposed to the scale bar. In this case, the guide bar configures the guide surface forming member. As a matter of course, another configuration can also be employed. The place where grating RG is arranged on the measurement bar 71 side can be, for example, measurement bar 71, or a plate of a nonmagnetic material or the like that is arranged on the entire surface or at least one surface on surface plate 14A (14B).

Further, in the embodiment above, while the case has been described where measurement bar 71 and main frame BD are integrated, this is not intended to be limiting, and measurement bar 71 and main frame BD can physically be separated. In such a case, a measurement device (e.g. an encoder and/or an interferometer, or the like) that measures the position (or displacement) of measurement bar 71 with respect to main frame BD (or a reference position), and an actuator or the like that adjusts the position of measurement bar 71 should be arranged, and based on the measurement result of the measurement device, main controller 20 and/or another controller should maintain the positional relation between main frame BD (and projection optical system PL) and measurement bar 71 in a predetermined relation (e.g. constant).

Further, a measurement system (sensor) that measures variation of measurement bar 71 with an optical method, a temperature sensor, a pressure sensor, an acceleration sensor for vibration measurement, and the like can be arranged at measurement bar 71. Further, a distortion sensor, a displacement sensor and the like to measure deformation (such as twist) of measurement bar 71 can be arranged. Then, it is also possible to correct the positional information obtained by fine movement stage position measuring system 70 and/or coarse movement stage position measuring systems 68A and 68B, using the values obtained by these sensors.

Further, while the case has been described where the embodiment above is applied to stage device (wafer stages) 50 of the exposure apparatus, this is not intended to be limiting, and the embodiment above can also be applied to reticle stage RST.

Incidentally, in the embodiment above, grating RG can be covered with a protective member, e.g. a cover glass, so as to be protected. The cover glass can be arranged to cover the substantially entire surface of the lower surface of main section 80, or can be arranged to cover only a part of the lower surface of main section 80 that includes grating RG. Further, while a plate-shaped protective member is desirable because the thickness enough to protect grating RG is required, a thin film-shaped protective member can also be used depending on the material.

Besides, it is also possible that a transparent plate, on one surface of which grating RG is fixed or formed, has the other surface that is placed in contact with or in proximity to the back surface of the wafer holder and a protective member (cover glass) is arranged on the one surface side of the transparent plate, or the one surface of the transparent plate on which grating RG is fixed or formed is placed in contact with or in proximity to the back surface of the wafer holder without arranging the protective member (cover glass). Especially in the former case, grating RG can be fixed or formed on an opaque member such as ceramics instead of the transparent plate, or grating RG can be fixed or formed on the back surface of the wafer holder. In the latter case, even if the wafer holder expands or the attachment position with respect to the fine movement stage shifts during exposure, the position of the wafer holder (wafer) can be measured according to the expansion or the shift. Or, it is also possible that the wafer holder and grating RG are merely held by the conventional fine movement stage. Further, it is also possible that the wafer holder is formed by a solid glass member, and grating RG is placed on the upper surface (wafer mounting surface) of the glass member.

Incidentally, in the embodiment above, while the case has been described as an example where the wafer stage is a coarse/fine movement stage that is a combination of the coarse movement stage and the fine movement stage, this is not intended to be limiting. Further, in the embodiment above, while fine movement stages WFS1 and WFS2 can be driven in all the directions of six degrees of freedom, this is not intended to be limiting, and the fine movement stages should be moved at least within the two-dimensional plane parallel to the XY plane. Moreover, fine movement stages WFS1 and WFS2 can be supported in a contact manner by coarse movement stages WCS1 and WCS2. Consequently, the fine movement stage driving system to drive fine movement stage WFS1 or WFS2 with respect to coarse movement stage WCS1 or WCS2 can be a combination of a rotary motor and a ball screw (or a feed screw).

Incidentally, the fine movement stage position measuring system can be configured such that the position measurement can be performed in the entire area of the movement range of the wafer stages. In such a case, the coarse movement stage position measuring systems become unnecessary.

Incidentally, the wafer used in the exposure apparatus of the embodiment above can be any one of wafers with various sizes, such as a 450-mm wafer or a 300-mm wafer.

Incidentally, in the embodiment above, while the case has been described where the exposure apparatus is the liquid immersion type exposure apparatus, this is not intended to be limiting, and the embodiment above can suitably be applied to a dry type exposure apparatus that performs exposure of wafer W without liquid (water).

Incidentally, in the embodiment above, while the case has been described where the exposure apparatus is a scanning stepper, this is not intended to be limiting, and the embodiment above can also be applied to a static exposure apparatus such as a stepper. Even in the stepper or the like, occurrence of position measurement error caused by air fluctuation can be reduced to almost zero by measuring the position of a stage on which an object that is subject to exposure is mounted using an encoder. Therefore, it becomes possible to set the position of the stage with high precision based on the measurement values of the encoder, and as a consequence, high-precision transfer of a reticle pattern onto the object can be performed. Further, the embodiment above can also be applied to a reduced projection exposure apparatus by a step-and-stitch method that synthesizes a shot area and a shot area.

Further, the magnification of the projection optical system in the exposure apparatus in the embodiment above is not only a reduction system, but also can be either an equal magnifying system or a magnifying system, and the projection optical system is not only a dioptric system, but also can be either a catoptric system or a catadioptric system, and in addition, the projected image can be either an inverted image or an erected image.

Further, illumination light IL is not limited to ArF excimer laser light (with a wavelength of 193 nm), but can be ultraviolet light such as KrF excimer laser light (with a wavelength of 248 nm), or vacuum ultraviolet light such as $F_2$ laser light (with a wavelength of 157 nm). As disclosed in, for example, U.S. Pat. No. 7,023,610, a harmonic wave, which is obtained by amplifying a single-wavelength laser beam in the infrared or visible range emitted by a DFB semiconductor laser or fiber laser with a fiber amplifier doped with, for example, erbium (or both erbium and ytterbium), and by converting the wavelength into ultraviolet light using a nonlinear optical crystal, can also be used as vacuum ultraviolet light.

Further, in the embodiment above, illumination light IL of the exposure apparatus is not limited to the light having a wavelength more than or equal to 100 nm, and it is needless to say that the light having a wavelength less than 100 nm can be used. For example, the embodiment above can be applied to an EUV (Extreme Ultraviolet) exposure apparatus that uses an EUV light in a soft X-ray range (e.g. a wavelength range from 5 to 15 nm). In addition, the embodiment above can also be applied to an exposure apparatus that uses charged particle beams such as an electron beam or an ion beam.

Further, in the embodiment above, a light transmissive type mask (reticle) is used, which is obtained by forming a predetermined light-shielding pattern (or a phase pattern or a light-attenuation pattern) on a light-transmitting substrate, but instead of this reticle, as disclosed in, for example, U.S. Pat. No. 6,778,257, an electron mask (which is also called a variable shaped mask, an active mask or an image generator, and includes, for example, a DMD (Digital Micromirror Device) that is a type of a non-emission type image display element (spatial light modulator) or the like) on which a light-transmitting pattern, a reflection pattern, or an emission pattern is formed according to electronic data of the pattern that is to be exposed can also be used. In the case of using such a variable shaped mask, a stage on which a wafer, a glass plate or the like is mounted is scanned relative to the variable shaped mask, and therefore the equivalent effect to the embodiment above can be obtained by measuring the position of this stage using an encoder system.

Further, as disclosed in, for example, PCT International Publication No. 2001/035168, the embodiment above can also be applied to an exposure apparatus (a lithography system) in which line-and-space patterns are formed on wafer W by forming interference fringes on wafer W.

Moreover, the embodiment above can also be applied to an exposure apparatus that synthesizes two reticle patterns on a wafer via a projection optical system and substantially simultaneously performs double exposure of one shot area on the wafer by one scanning exposure, as disclosed in, for example, U.S. Pat. No. 6,611,316.

Incidentally, an object on which a pattern is to be formed (an object subject to exposure on which an energy beam is irradiated) in the embodiment above is not limited to a wafer, but may be another object such as a glass plate, a ceramic substrate, a film member, or a mask blank.

The usage of the exposure apparatus is not limited to the exposure apparatus used for manufacturing semiconductor devices, but the embodiment above can be widely applied also to, for example, an exposure apparatus for manufacturing liquid crystal display elements in which a liquid crystal display element pattern is transferred onto a rectangular glass plate, and to an exposure apparatus for manufacturing organic EL, thin-film magnetic heads, imaging devices (such as CCDs), micromachines, DNA chips or the like. Further, the embodiment above can also be applied to an exposure apparatus that transfers a circuit pattern onto a glass substrate, a silicon wafer or the like not only when producing microdevicea such as semiconductor devices, but also when producing a reticle or a mask used in an exposure apparatus such as an optical exposure apparatus, an EUV exposure apparatus, an X-ray exposure apparatus, and an electron beam exposure apparatus.

Incidentally, the disclosures of all publications, the PCT International Publications, the U.S. Patent Application Publications and the U.S. patents that are cited in the description so far related to exposure apparatuses and the like are each incorporated herein by reference.

Electron devices such as semiconductor devices are manufactured through the following steps: a step where the function/performance design of a device is performed; a step where a reticle based on the design step is manufactured; a step where a wafer is manufactured using a silicon material; a lithography step where a pattern of a mask (the reticle) is transferred onto the wafer with the exposure apparatus (pattern formation apparatus) of the embodiment described earlier and the exposure method thereof; a development step where the exposed wafer is developed; an etching step where an exposed member of an area other than an area where resist remains is removed by etching; a resist removing step where the resist that is no longer necessary when the etching is completed is removed; a device assembly step (including a dicing process, a bonding process, and a packaging process); an inspection step; and the like. In this case, in the lithography step, the exposure method described earlier is executed using the exposure apparatus of the embodiment above and device patterns are formed on the wafer, and therefore, the devices with high integration degree can be manufactured with high productivity.

While the above-described embodiment of the present invention is the presently preferred embodiment thereof, those skilled in the art of lithography systems will readily recognize that numerous additions, modifications, and substitutions may be made to the above-described embodiment without departing from the spirit and scope thereof. It is intended that all such modifications, additions, and substitutions fall within the scope of the present invention, which is best defined by the claims appended below.

What is claimed is:

1. A movable body apparatus, comprising:
a first movable body;
a second movable body formed into a frame shape that encloses a periphery of the first movable body, which supports the first movable body such that the first movable body is relatively movable, and which is Movable along a predetermined two-dimensional plane that includes a first axis and a second axis;
a planar motor that drives the second movable body in a predetermined range within the two-dimensional plane; and
an actuator that drives the first movable body with respect to the second movable body.

2. The movable body apparatus according to claim 1, wherein
the second movable body is a rectangular frame-shaped member that has a pair of driven members that each have a mover of the planar motor and are placed parallel to the first axis, at a predetermined distance in a direction parallel to the second axis, and a pair of connecting members that are placed parallel to the second axis and connect one ends of the pair of driven members in a direction parallel to the first axis and connect the other ends of the pair of driven members.

3. The movable body apparatus according to claim 2, wherein
the first movable body has one end and the other end in the direction parallel to the second axis that are respectively supported by the pair of driven members.

4. The movable body apparatus according to claim 2, wherein
at the pair of driven members, a part of the actuator is placed.

5. The movable body apparatus according to claim 2, further comprising:
a supply route member that is installed between at least one of the pair of connecting members and the first movable body and forms a supply route used to supply power usage from the outside to the first movable body.

6. The movable body apparatus according to claim 5, wherein
a recessed section is formed at a side surface of the first movable body, the side surface being opposed to the connecting member, and
an end of the supply route member on the first movable body side is placed within the recessed section.

7. The movable body apparatus according to claim 1, wherein
the actuator is a planar motor.

8. The movable body apparatus according to claim 1, wherein
the actuator is a linear motor.

9. The movable body apparatus according to claim 1, wherein
the actuator is capable of driving the first movable body with respect to the second movable body in directions of six degrees of freedom that include the direction parallel to the first axis and the direction parallel to the second axis.

10. The movable body apparatus according to claim 1, wherein
the actuator is capable of generating thrust in a direction parallel to a third axis that is orthogonal to the two-dimensional plane, at least at three noncollinear positions within the two-dimensional plane individually.

11. The movable body apparatus according to claim 1, wherein
the actuator is capable of generating thrust in a tilt direction with respect to the two-dimensional plane, at least at three noncollinear positions within the two-dimensional plane individually.

12. The movable body apparatus according to claim 1, wherein
at the second movable body, an opening section that penetrates in the direction parallel to the third axis orthogonal to the two-dimensional plane is formed, and
the first movable body is placed within the opening section.

13. The movable body apparatus according to claim 1, wherein
a surface of the second movable body and a surface of the first movable body are placed on a same plane parallel to the two-dimensional plane.

14. The movable body apparatus according to claim 1, wherein
a movement stroke of the first movable body with respect to the second movable body in the direction parallel to the first axis is longer than the movement stroke in the direction parallel to the second axis.

15. The movable body apparatus according to claim 1, wherein
the first movable body is supported by the second movable body in a noncontact manner.

16. An exposure apparatus that exposes an object with an energy beam, the apparatus comprising:
the movable body apparatus according to claim 1 in which the object is mounted on the first movable body.

17. A device manufacturing method, comprising:
exposing an object using the exposure apparatus according to claim 16 and
developing the exposed object.

* * * * *